(12) United States Patent
Ishikawa et al.

(10) Patent No.: US 7,654,887 B2
(45) Date of Patent: Feb. 2, 2010

(54) VACUUM CHUCK AND SUCTION BOARD

(75) Inventors: Shigeharu Ishikawa, Ibi-gun (JP); Katsuyuki Kiriyama, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 204 days.

(21) Appl. No.: 11/525,820

(22) Filed: Sep. 25, 2006

(65) Prior Publication Data

US 2007/0063453 A1      Mar. 22, 2007

Related U.S. Application Data

(63) Continuation of application No. PCT/JP2005/005563, filed on Mar. 25, 2005.

(30) Foreign Application Priority Data

| Mar. 25, 2004 | (JP) | 2004-090105 |
| Mar. 26, 2004 | (JP) | 2004-093573 |
| Mar. 26, 2004 | (JP) | 2004-093574 |
| Mar. 26, 2004 | (JP) | 2004-093575 |

(51) Int. Cl.
*B24B 47/00* (2006.01)
(52) U.S. Cl. ................... 451/388; 451/398
(58) Field of Classification Search ........... 451/388, 451/397, 398, 285–289
See application file for complete search history.

(56) References Cited

U.S. PATENT DOCUMENTS 4,906,011 A * 3/1990 Hiyamizu et al. ............ 279/3
5,645,474 A * 7/1997 Kubo et al. ................ 451/287
6,517,420 B2 * 2/2003 Ishikawa et al. ............. 451/67
7,018,268 B2 * 3/2006 Kassir et al. .................. 451/5

FOREIGN PATENT DOCUMENTS

| JP | 3-32537 | 2/1991 |
| JP | 5-13051 | 2/1993 |
| JP | 6-8086 | 1/1994 |
| JP | 6-143073 | 5/1994 |
| JP | 8-1464 | 1/1996 |
| JP | 8-39376 | 2/1996 |
| JP | 3026677 | 5/1996 |
| JP | 8-148548 | 6/1996 |
| JP | 9-174364 | 7/1997 |
| JP | 10-128634 | 5/1998 |
| JP | 11-10472 | 1/1999 |
| JP | 11-320394 | 11/1999 |
| JP | 2000-15573 | 1/2000 |
| JP | 2000-232083 | 8/2000 |
| JP | 2002-36102 | 2/2002 |
| JP | 2002-103213 | 4/2002 |
| JP | 2004-283936 | 10/2004 |

* cited by examiner

*Primary Examiner*—Dung Van Nguyen
(74) *Attorney, Agent, or Firm*—Oblon, Spivak, McClelland, Maier & Neustadt, L.L.P.

(57) ABSTRACT

The vacuum chuck according to the present invention is provided with a sucking plate for sucking and holding an object to be sucked, in which a sucking layer made of a porous ceramic and a dense material layer are integrated, the sucking layer being located on the side for sucking the object to be sucked, wherein the dense material layer is formed by impregnating the porous ceramic with a metal.

4 Claims, 11 Drawing Sheets

VACUUM CHUCK AND SUCTION BOARD

CROSS-REFERENCE TO RELATED APPLICATIONS

This application is a continuation application of PCT/JP2005/005563 filed on Mar. 25, 2005, which claims priority of Japanese Patent Application No. 2004-90105 filed on Mar. 25, 2004, and Japanese Patent Application Nos. 2004-093573, 2004-093574 and 2004-093575 filed on Mar. 26, 2004. The contents of these applications are incorporated herein by reference in their entirety.

BACKGROUND OF THE INVENTION

1. Field of the Invention

The present invention relates to a vacuum chuck and a sucking plate used to suck an object to be sucked, such as semiconductor wafers, so that heat treatment, a grinding process, a polishing process, a CVD process or a PVD process, such as sputtering, for example, can be carried out on the object to be sucked. In particular, the invention relates to an appropriate vacuum chuck and sucking plate preferably used to polish the surface of semiconductor wafers and the like.

2. Discussion of the Background

In general, in manufacturing a semiconductor product, a single crystal silicon ingot is thinly sliced, and after that, the surface of the slices is ground, lapped and polished, and thereby, silicon wafers polished to a mirror surface can be gained.

This step of grinding/polishing a silicon wafer is an indispensable, important step for manufacturing precise semiconductor products (semiconductor chips), and in this step of grinding/polishing a silicon wafer, it becomes necessary a wafer grinding/polishing apparatus where a silicon wafer is secured and ground/polished. For this reason, various types of conventional wafer grinding/polishing apparatuses have been proposed.

Wafer polishing apparatuses where a semiconductor wafer is bonded to the holding surface of a wafer holding jig using an adhesive and then polishing is carried out have been used as a conventional apparatus (see for example JP-A 11-320394).

FIG. 1 is a cross sectional view schematically showing an enlarged portion of an example of a conventional wafer polishing apparatus. As shown in FIG. 1, this wafer polishing apparatus 700 is comprised of: wafer holding jigs 701 in disc form which are configured so as to hold semiconductor wafers 715 downward and let these semiconductor wafers 715 make contact with a polishing surface 725a of a table 725, and after that, rotate, so that the surface of semiconductor wafers 715 is polished; and a rotatable table 725 having a polishing surface 725a.

A pusher rod 724 is secured to the center portion of the surface on the side opposite to the holding surface 721 of a wafer holding jig 701, and this pusher rod 724 is connected to a driving means, not shown, so that the pusher rod 724 and the wafer holding jig 701 rotate when this driving means is driven. In addition, the semiconductor wafer 715 adheres to and is held by interposing an adhesive layer made of a thermoplastic wax and the like formed on the holding surface 721 of the wafer holding jig 701.

Upon polishing semiconductor wafers 715, the wafer holding jigs 701 and the table 725 are rotated, and then, the wafer holding jigs 701 or the table 725 is moved upward and downward, so that the semiconductor wafers 715 and the polishing surface 725a of the table 725 are contacted to each other, and thereby, the semiconductor wafers 715 are polished.

Moreover, polishing apparatuses using a vacuum chuck for making attachment and removal of a semiconductor wafer easy have been proposed (see for example JP-A 2000-15573).

In addition, vacuum chucks having a porous ceramic plate and an outer periphery sealing layer made of a dense ceramic which is glass joined to the outer periphery of this porous ceramic plate have been proposed as another type of wafer grinding/polishing apparatus (see for example JP-U 2555938).

Specifically, a vacuum chuck as that shown in FIG. 2 is disclosed. That is to say, a vacuum chuck made of a sucking body is disclosed, where porous ceramic 501 in disc form which is impregnated with low melting point glass 504 in the peripheral portion and on the upper surface of which a suction surface 501a is formed is fitted to an outer periphery sealing layer 502 in the cylindrical form having a bottom having air sucking portions 506 made of a dense ceramic, and the border portion between these is glass joined with low melting point glass 505.

Further, in order for the wafer grinding/polishing apparatus to suck wafers of different sizes, wafer grinding/polishing apparatuses have been proposed, where a porous body made of a porous ceramic or sintered plastic, for example, is used as the suction table, and a layer made of an air blocking epoxy resin is formed on this suction table through impregnation or application (see for example JP-A 6-143073 and JP-A 8-39376).

In addition, wafer grinding/polishing apparatuses which can handle wafers of different sizes (universal chuck mechanism) have also been disclosed (see for example JP-A 3-32537, JP-A 8-1464, JP-A 8-148548, JP-A 9-174364 and JP-A 2000-232083).

Universal chuck mechanisms as that shown in FIGS. 3A and 3B are disclosed as specific examples. That is to say, a universal chuck mechanism having (A) a plate for attaching a wafer 625 where an air permeable porous ceramic disc 622 is formed at the center, a number of air permeable porous ceramic annular bodies 623a, 623b, 623c and 623d having the same center and the same height are arranged around the outer circumference of this disc and air impermeable thin film annular partitions 624a to 624d having a width of several mm and the same height as the above-described disc are arranged between the above-described air permeable porous ceramic disc 622 and air permeable porous ceramic annular body 623a, as well as between these air permeable porous ceramic annular bodies 623a to 623d, and all of these members form a single disc, (B) a frame for housing the plate for attaching a wafer 630, having a recessed annular edge portion 626 for housing a plate for attaching a wafer 625 on the upper surface, where a concave portion 627 is provided at the center of the upper portion, which is located on the lower side of the plate for attaching a wafer 625, a number of annular grooves 628a to 628d serving as a path for a fluid are provided in concentric circles with the concave portion 627 at the center, and a number of air sucking holes 629 are respectively provided in the vertical direction in these annular grooves, and (C) a securing base 631 having air sucking portions which are connect to the annular grooves 628a to 628d which are provided in the plate for attaching the wafer 625, to which the frame for housing the plate for attaching a wafer 630 can be secured is disclosed.

The contents of JP-A 11-320394, JP-A 2000-15573, JP-U 2555938, JP-A 6-143073, JP-A 8-39376, JP-A 3-32537, JP-A 8-1464, JP-A 8-148548, JP-A 9-174364 and JP-A 2000-232083 are incorporated herein by reference in their entirety.

SUMMARY OF THE INVENTION

A vacuum chuck according to the first present invention is provided with a sucking plate for sucking and holding an object to be sucked, in which a sucking layer made of a porous ceramic and a dense material layer are integrated, the sucking layer being located on the side for sucking the object to be sucked, wherein the dense material layer is formed by impregnating the porous ceramic with a metal.

In the vacuum chuck according to the first present invention, it is desirable for one or more of an annular partition layer(s) for blocking permeation of air to be formed in the above-described sucking layer, and it is desirable for the outer edge of the above-described annular partition layer to be located in a region about 0.5 to about 15 mm of inside the outer edge of the above-described object to be sucked in the configuration.

In the vacuum chuck according to the first present invention, it is desirable for the thickness of the above-described annular partition layer to be about 0.1 to about 1.0 mm, and it is desirable for the Young's modulus and the coefficient of thermal expansion of the above-described annular partition layer to be almost the same as the Young's modulus and the coefficient of thermal expansion of the above-described porous ceramic.

A vacuum chuck according to the second present invention is provided with a sucking plate for sucking and holding an object to be sucked, which is comprised of a sucking layer made of at least a porous ceramic and an annular partition layer for blocking permeation of air, wherein the annular partition layer is formed by glass with which a nonoxide-based ceramic powder is mixed therein.

In the vacuum chuck according to the second present invention, it is desirable for one or more of an annular partition layer(s) which are the same as the above-described annular partition layer to be formed in the above-described sucking layer, and it is desirable for the outer edge of the above-described annular partition layer to be located in a region of about 0.5 to about 15 mm inside the outer edge of the above-described object to be sucked in the configuration.

In the vacuum chuck according to the second present invention, it is desirable for the thickness of the above-described annular partition layer to be about 0.1 to about 1.0 mm, and it is desirable for the Young's modulus and the coefficient of thermal expansion of the above-described annular partition layer to be almost the same as the Young's modulus and the coefficient of thermal expansion of the above-described porous ceramic.

A vacuum chuck according to the third present invention is provided with a sucking plate for sucking and holding an object to be sucked, and a holder for holding said sucking plate, wherein the sucking plate is comprised of a suction portion through which air permeates and an annular partition layer for blocking permeation of air, and the entirety of the suction portion from a surface where said sucking plate makes contact with the holder to a surface where the sucking plate makes contact with the object to be sucked is formed by a porous ceramic.

In the vacuum chuck according to the third present invention, it is desirable for the degree of flatness of the surface where the above-described sucking plate makes contact with the above-described object to be sucked to be about 5 µm or less.

In addition, in the vacuum chuck according to the third present invention, it is desirable for the difference in height between a portion made of the suction portion and a portion made of the above-described annular partition layer on the surface where the above-described sucking plate makes contact with the above-described object to be sucked to be about 0.5 µm or less.

In addition, in the vacuum chuck according to the third present invention, it is desirable for the Young's modulus and the coefficient of thermal expansion of the material for the above-described annular partition layer to be almost the same as the Young's modulus and the coefficient of thermal expansion of the above-described porous ceramic.

In addition, in the vacuum chuck according to the third present invention, it is desirable for the material for the above-described porous ceramic to be silicon carbide.

In addition, in the vacuum chuck according to the third present invention, it is desirable for the thickness of the above-described annular partition layer to be about 0.1 to about 1.0 mm.

Furthermore, in the vacuum chuck according to the third present invention, it is desirable for the outer edge of the above-described annular partition layer to be located in a region of about 0.5 to about 15 mm inside the outer edge of the above-described object to be sucked in the configuration.

A sucking plate according to the fourth present invention is configured by comprising a suction portion which is integrated with a holder for holding a sucking plate for use, and through which air permeates, and an annular partition layer for blocking permeation of air, wherein the entirety of the suction portion from a surface where the sucking plate makes contact with the holder to a surface where the sucking plate makes contact with the object to be sucked is formed by a porous ceramic.

In the sucking plate according to the fourth present invention, it is desirable for the degree of flatness of the surface where the above-described sucking plate makes contact with the above-described object to be sucked to be about 5 µm or less.

In addition, in the sucking plate according to the fourth present invention, it is desirable for the difference in height between a portion made of the suction portion and a portion made of the above-described annular partition layer on the surface where the above-described sucking plate makes contact with the above-described object to be sucked to be about 0.5 µm or less.

In addition, in the sucking plate according to the fourth present invention, it is desirable for the Young's modulus and the coefficient of thermal expansion of the material for the above-described annular partition layer to be almost the same as the Young's modulus and the coefficient of thermal expansion of the above-described porous ceramic.

In addition, in the sucking plate according to the fourth present invention, it is desirable for the material for the above-described porous ceramic to be silicon carbide.

In addition, in the sucking plate according to the fourth present invention, it is desirable for the thickness of the above-described annular partition layer to be about 0.1 to about 1.0 mm.

Furthermore, in the sucking plate according to the fourth present invention, it is desirable for the outer edge of the above-described annular partition layer to be located in a region of about 0.5 to about 15 mm inside the outer edge of the above-described object to be sucked in the configuration.

A vacuum chuck according to the fifth present invention is configured by comprising a sucking body made of a porous ceramic, having a holding surface for sucking and holding an object to be sucked; and a sealing body for sealing approximately the entirety of a surface of the sucking body, excluding the holding surface and an air sucking hole corresponding portion, wherein when the pore distribution in the sucking body is measured in accordance with a mercury injection method, the average pore diameter is 10 to 40 μm, the ratio of pores having a pore diameter of 0.7 to 1.2 times of the average pore diameter to the total volume of pores is about 75% or more, the ratio of pores having a pore diameter of less than 0.7 times of the average pore diameter to the total volume of pores is about 15% or less, and the ratio of pores having a pore diameter of more than 1.2 times of the average pore diameter to the total volume of pores is about 10% or less.

A vacuum chuck according to the sixth present invention is configured by comprising a sucking body made of a porous ceramic, having a holding surface for sucking and holding an object to be sucked, on which a sealing layer for sealing approximately the entirety of a surface, excluding said holding surface and an air sucking holes corresponding portion is formed, wherein when the pore distribution in the sucking body is measured in accordance with a mercury injection method, the average pore diameter is 10 to 40 μm, the ratio of pores having a pore diameter of 0.7 to 1.2 times of the average pore diameter to the total volume of pores is about 75% or more, the ratio of pores having a pore diameter of less than 0.7 times of the average pore diameter to the total volume of pores is about 15% or less, and the ratio of pores having a pore diameter of more than 1.2 times of the average pore diameter to the total volume of pores is about 10% or less.

In the vacuum chuck according to the sixth present invention, it is desirable for the sealing layer in the neighborhood of the holding surface of the sucking body to be a coating layer formed on a surface of the above-described sucking body.

In addition, in the vacuum chucks according to the fifth and sixth present inventions, it is desirable for the porosity of the above-described sucking body to be about 20 to about 50%.

DESCRIPTION OF THE EMBODIMENTS

In the following, embodiments of the first to sixth present inventions are described in turn. In addition, in the present specification, the surface which sucks an object to be sucked is referred to as holding surface, and the surface for sucking air within the sucking plate is referred to as suction surface.

First, the vacuum chuck according to the embodiment of the first present invention is described.

The vacuum chuck according to the embodiment of the first present invention is a vacuum chuck comprising a sucking plate for sucking and holding an object to be sucked, in which a sucking layer made of a porous ceramic and a dense material layer are integrated, the sucking layer being located on the side for sucking the object to be sucked, wherein the dense material layer is formed by impregnating the porous ceramic with a metal.

In the following, the vacuum chuck according to the embodiment of the first present invention is described in reference to the drawings.

Figure 1:
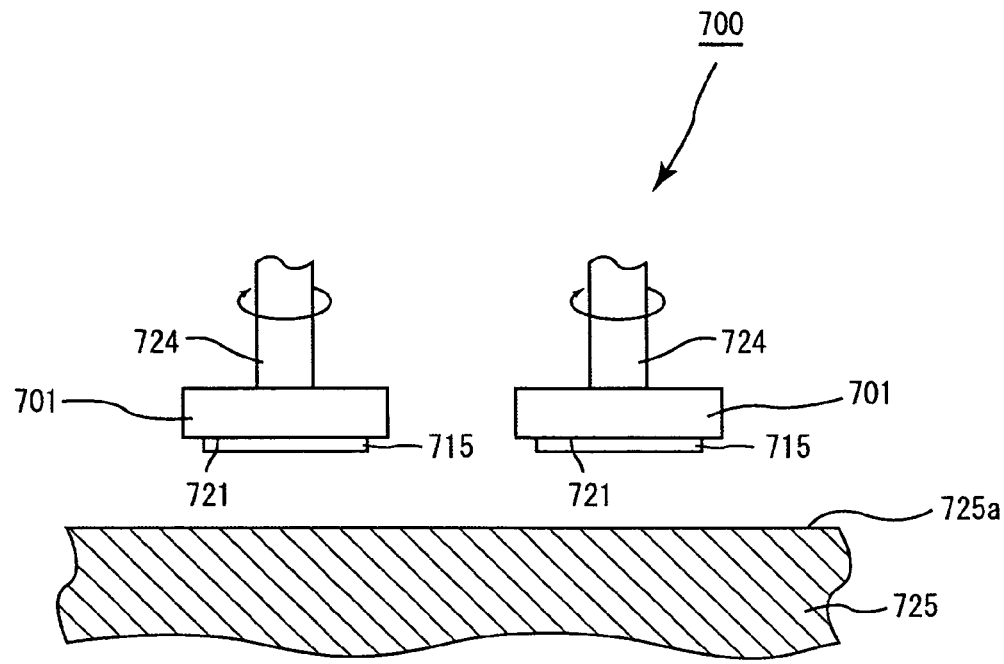
FIG. 1 is a cross sectional view of an enlarged portion schematically showing an example of a conventional wafer polishing apparatus.
Figure 2:
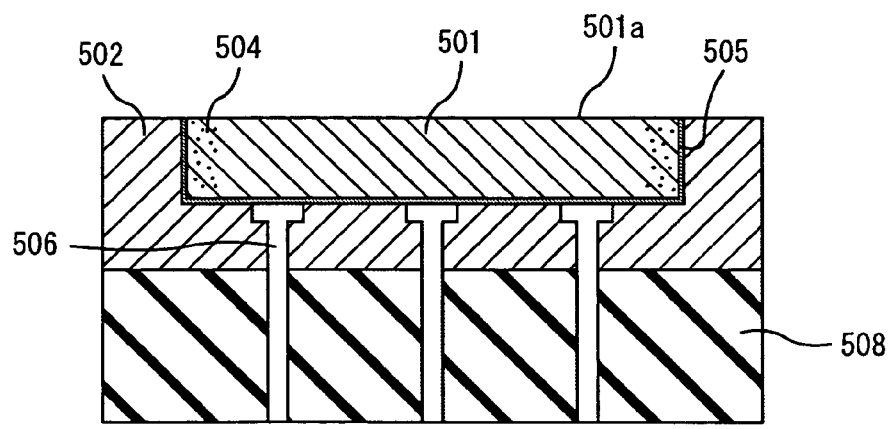
FIG. 2 is a cross sectional view of an enlarged portion schematically showing another example of a conventional wafer polishing apparatus.
Figure 3A:
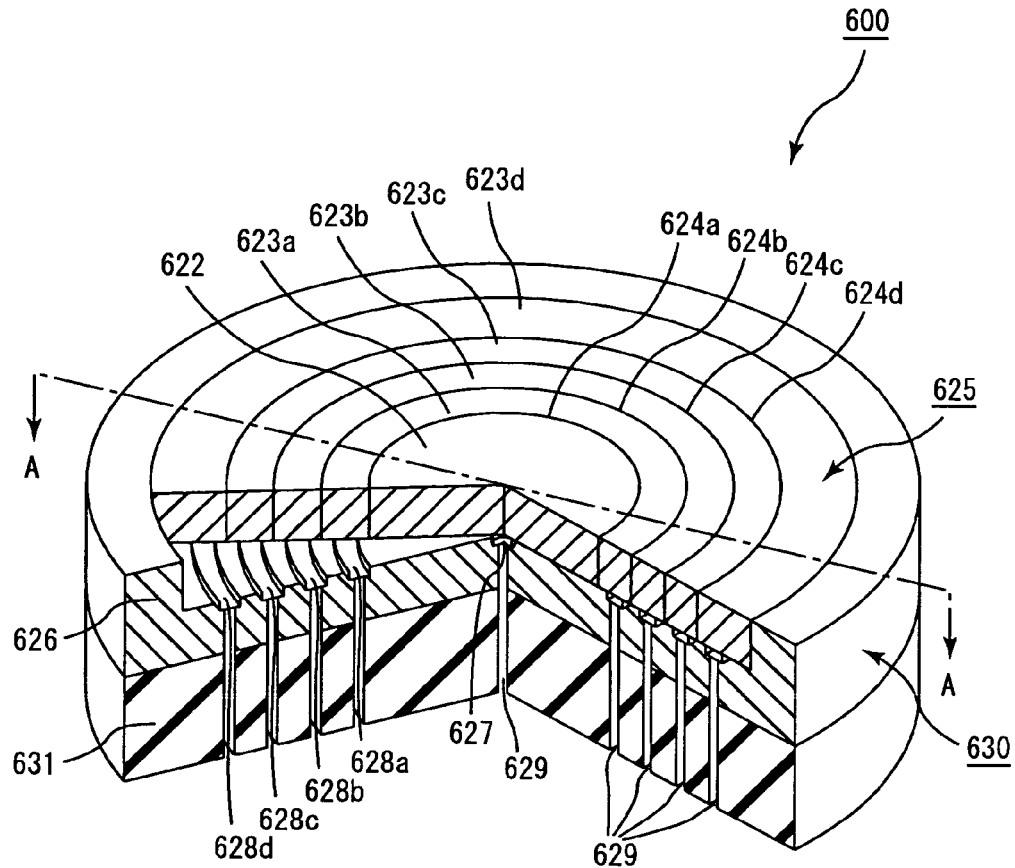
FIG. 3 is a cross sectional view of an enlarged portion schematically showing yet another example of a conventional wafer polishing apparatus.
Figure 3B:
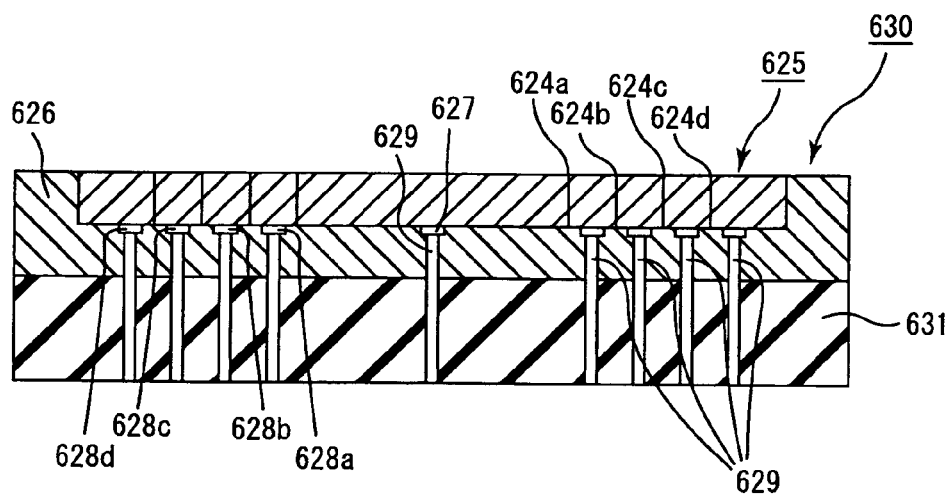
Figure 4A:
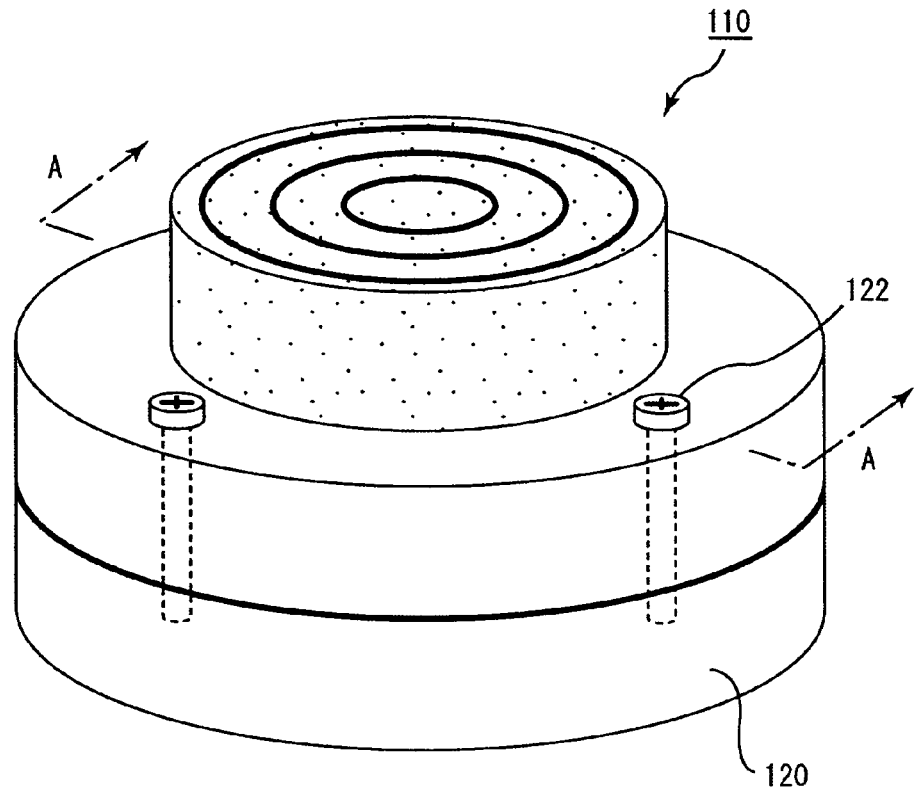
FIG. 4A is a perspective view schematically showing an example of a vacuum chuck according to the embodiment of the first present invention.
Figure 4B:
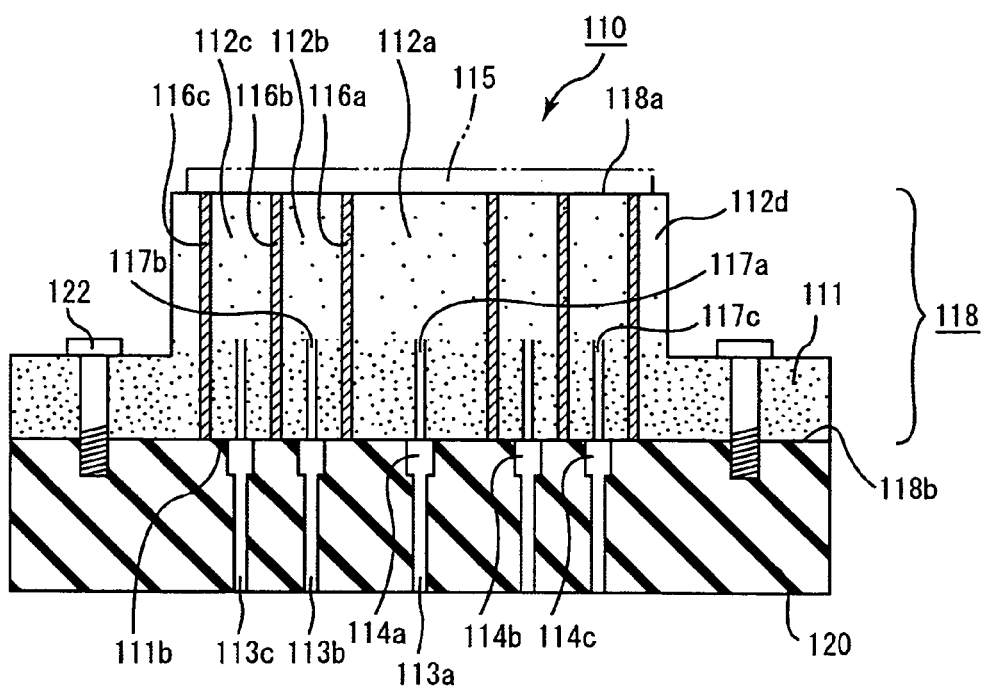
FIG. 4B is an A-A line cross-sectional view of FIG. 4A.

FIG. 4A is a perspective view schematically showing an example of a vacuum chuck according to the embodiment of the first present invention, and FIG. 4B is an A-A line cross-sectional view of FIG. 4A.

As shown in FIGS. 4A and 4B, a vacuum chuck 110 is provided with a sucking plate 118 for sucking and holding a semiconductor wafer (object to be sucked) 115, and one of the main surfaces of the sucking plate 118 (upper surface in the figure) functions as a surface 118a for sucking and holding an object to be sucked (hereinafter referred to as holding surface), and the other main surface (lower surface in the figure) functions as a surface 118b for sucking out air within the sucking plate (hereinafter referred to as suction surface).

In this sucking plate 118, a sucking layer 112 (112a to 112d) made of a porous ceramic is located on the side of holding surface 118a (side for sucking object to be sucked), and a dense material layer 111 is located on the suction surface 118b, and the two are integrated.

In addition, annular partition layers 116a to 116c in concentric circular form for blocking permeation of air are formed inside the sucking plate 118. In addition, air sucking holes 117 (117a to 117c) are formed in each of the regions of the dense material layer 111 which are separated by the annular partition layers 116a to 116c so as to pass through the dense material layer 111. Here, the above-described air sucking holes may be formed so as to pass through at least the dense material layer 111, and may be, for example, formed so as to pass through only the dense material layer, or may be formed so as to pass through the dense material layer and a portion of the sucking layer.

In addition, the sucking plate 118 has a form where two discs having a different diameter are layered on top of each other (form of a disc having a brim).

In the vacuum chuck 110, a holder 120 in which a vacuum apparatus, not shown, such as a vacuum pump, is connected to air sucking portions 113 is secured to the lower portion of the sucking plate 118 using four bolts 122 which are set in at equal intervals. Here, the number of bolts is not limited to four, and generally approximately 4 to 12 of bolts are used.

In addition, air sucking portions 113 (113a to 113c) where grooves 114 (114a to 114c) are formed in portions of the sucking plate 118 which make contact with the suction surface 118b are provided in the holder 120.

In addition, the air sucking holes 117 (117a to 117c) which are formed in the dense material layer 111 of the sucking plate 118 are respectively connected to the air sucking portions 113 (113a to 113c) which are formed in the holder 120 via the grooves 114 (114a to 114c).

Accordingly, the vacuum chuck 110 is formed so that air within the sucking layers 112a to 112c is sucked out through the air sucking holes 117 (117a to 117c), the grooves 114 (114a to 114c) and the air sucking portions 113a to 113c using a vacuum pump (not shown).

In addition, though the porous ceramic is exposed from the side of the sucking layer 112d in the vacuum chuck 110 shown in FIG. 4, a layer through which air does not permeates may be formed in this portion. As a result, a polishing liquid and a grinding liquid can be prevented from penetrating. Here, the layer through which air does not permeate may be made of the same material as the above-described annular partition layer or dense material layer.

The vacuum chuck 110 of this embodiment can suck and hold an object to be sucked 115 by sucking out air from the inside of the sucking layers 112a to 112c made of a porous ceramic.

Furthermore, object to be sucked, such as semiconductor wafers of different sizes, can be sucked by selecting appropriate sucking layers from which air is sucked out. Specifically, when an object to be sucked of which the size is slightly greater than the size of the outermost annular partition layer 116c in a plan view is sucked, the vacuum pump is operated so as to suck out the air from all of the air sucking portions 113a to 113c, and thereby, the object to be sucked is sucked. When an object to be sucked of which the size is slightly greater than the size of the annular partition layer 116b in a plan view is sucked, the object to be sucked is sucked by sucking out air from the air sucking portions 113a and 113b. When an object to be sucked of which the size is slightly greater than the size of the annular partition layer 116a in a plan view is sucked, the object to be sucked is sucked by sucking out air only from the air sucking portion 113a.

In the vacuum chuck according to the embodiment of the first present invention, the number of annular partition layers which are formed in the sucking plate is not limited to three as shown in FIG. 4, and in the case where two types of semiconductor wafers of a different size are sucked as the object to be sucked, at least two annular partition layers may be formed, and in the case where three types of semiconductor wafers of a different size are sucked as the object to be sucked, at least three annular partition layers may be formed. In addition, in the case where the size of the object to be sucked is the same, it is not necessary to form any annular partition layers. Here, in the case where no annular partition layer is formed, it becomes necessary to form a layer through which air does not permeates on the side of the sucking layer.

In vacuum chuck according to the embodiment of the first present invention, in the case where at least two annular partition layers are formed inside the sucking plate, the vacuum chuck functions as a vacuum chuck which can suck and hold object to be sucked of different dimensions without fail.

It is desirable for the respective annular partition layers 116a to 116c to be formed in such a manner that the outer edge of the layers is located in a region of about 0.5 to about 15 mm inside the outer edge of the object to be sucked 115.

In the case where the outer edge of the above-described annular partition layer is located in a region of about 0.5 mm or more inside the outer edge of the object to be sucked in the configuration, air may not leak when the object to be sucked is attempted to be sucked, even if the surface around the outer edge of the silicon wafer which is the object to be sucked is generally rounded. In addition, in the case where the outer edge of the above-described annular partition layer is located in a region of about 15 mm or less inside the outer edge of the object to be sucked in the configuration, sufficient force for holding the object to be sucked can be gained when the object to be sucked is sucked.

Meanwhile, in the case where the outer edge of the above-described annular partition layer is located in a region within the above-described range in the configuration, the suction force is high, and the suction force is uniform throughout the entirety of the sucking plate, so that the object to be sucked can be uniformly ground/polished. In addition, this configuration allows the entirety of the holding surface of the sucking layer from which air is sucked out to be covered with the object to be sucked, and therefore, no clogging, for example, is caused in the sucking layer made of a porous ceramic at the time of the grinding/polishing process, and thus, the object to be sucked can be ground/polished for a long period of time with high precision.

Accordingly, in the case where the annular partition layers are in concentric circular form, and the object to be sucked such as a silicon wafer is in disc form, as shown in FIG. 4, it is desirable for the diameter (outer diameter) of the annular partition layers to be smaller than the diameter of the object to be sucked by about 0.5 to about 15 mm in a plan view.

Here, the fact that the outer edge of the annular partition layer is located in a region of about 0.5 to about 15 mm inside the outer edge of the above-described object to be sucked means that the outer edge of the annular partition layer appears in a region of about 0.5 to about 15 mm inside the outer edge of the object to be sucked in a plan view.

In addition, it is desirable for the thickness of the annular partition layers 116 to be about 0.1 to about 1.0 mm. In the case where the thickness of the annular partition layers is about 0.1 mm or more, permeation of air can be blocked, while in the case where the thickness is about 1.0 mm or less, the difference in height can be kept within the above-described range when the object to be sucked is held, ground and polished.

In the vacuum chuck 110, it is desirable for the holding surface 118a of the sucking plate 118 to have a degree of flatness of about 5 μm or less. This is because in the case where the degree of flatness is about 5 μm or less, the object to be sucked can be uniformly ground/polished with high precision, and furthermore, the suction force for sucking the object to be sucked may not lower. It is more desirable for the degree of flatness to be about 1 μm or less.

Here, in the present specification, the degree of flatness of the holding surface of the sucking plate is the difference (distance) between the highest point and the lowest point. Here, as for the portion made of a porous ceramic on the above-described holding surface, the height of portions where particles exist are plotted, and the difference (distance)

between the highest point and the lowest point is the degree of flatness. As a result, it is possible to evaluate the inequality on the holding surface. The degree of flatness is defined in this manner because the object to be sucked is supported by the portions where particles exist, out of the portions made of a porous ceramic on the holding surface, and therefore, the unevenness on the ground/polished surface of the object to be sucked is affected by the inequality in this portion when, for example, grinding/polishing is carried out. Here, the sucking layer is made of a porous ceramic, and therefore, there are portions where particles exist and portions where pores exist, as described above, on the surface of the portions made of a porous ceramic on the holding surface, and small unevenness is created due to this, and the size of this unevenness can be evaluated using the pore distribution and the like.

In addition, in the vacuum chuck 110 according to the embodiment of the first present invention, it is desirable for the difference in height between the portions made of the sucking layer and the portions made of the above-described annular partition layers on the holding surface 118a of the sucking plate 118 to be about 0.5 µm or less.

In the case where the above-described difference in height is about 0.5 µm or less, the object to be sucked can be sucked and held without fail, and the pattern of the differences in height may not be transferred to the surface of the object to be sucked, such as a silicon wafer. Therefore, the grinding/polishing precision for the object to be sucked does not lower. More desirable difference in height is about 0.1 µm or less.

Here, in the present specification, the difference in height as described above means the difference between the average height from the suction surface of the portion made of an sucking layer and a dense material layer to the holding surface and the average height from the suction surface of the annular partition layers to the holding surface.

In addition, in the vacuum chuck 110, it is desirable for the Young's modulus and the coefficient of thermal expansion of the annular partition layers 116a and 116b that form the sucking plate 118 to be almost the same as the Young's modulus and the coefficient of thermal expansion of the sucking layers 112a to 112d (porous ceramic) that form the sucking plate 118. This is because the ease of grinding of the sucking layer and the annular partition layers is almost the same, and therefore, it is appropriate for the degree of flatness of the holding surface 118a to be about 5 µm or less and the difference in height on the holding surface to be about 0.5 µm or less.

In addition, in the case where the Young's modulus is almost the same, it becomes difficult for warping and variation of the degree of flatness to occur in the sucking plate, and in the case where the coefficient of thermal expansion is almost the same, the risk of the precision deteriorating and peeling occurring due to friction heat and the like emitted at the time of polishing becomes smaller.

Here, in the present specification, the Young's modulus and the coefficient of thermal expansion being almost the same means that the values of the Young's modulus and the coefficient expansion of the annular partition layers are respectively in a range of about 80 to about 120% of the value of the Young's modulus and the coefficient of thermal expansion of the porous ceramic. Of course, the closer to about 100% the values are, the more desirable.

In the vacuum chuck 110, air is sucked out through the air sucking holes 117, the grooves 114 and the air sucking portions 113 using a vacuum pump (not shown), and thereby, a semiconductor wafer 115 placed on the holding surface 118a of the sucking plate 118 can be sucked and held. Here, the vacuum chuck 110 may have a rotation mechanism which allows rotation around the center axis of the sucking plate.

Here, though grooves or holes other than the air sucking holes are not created in the sucking plate 118 shown in FIG. 4, grooves or holes in various forms may be created in the suction surface 111b, for example, in order to increase the suction speed.

In the vacuum chuck 110, in the case where a grinding and polishing process is carried out, for example, a grinding stone is rotated in a state where the object to be sucked, such as a semiconductor wafer, and the axis of the grinding stone are parallel to each other, and the vacuum chuck 110 itself is rotated and the two make contact with each other, and thus, the surface of the semiconductor wafer can be ground.

In addition, the polishing table having a polishing surface is rotated, the vacuum chuck 110 is rotated, or the two are rotated in a state where the polishing table having a polishing surface and the object to be sucked, such as a semiconductor wafer, which are sucked on the holding surface, are parallel to each other, and the two make contact with each other, and thus, the surface of the semiconductor wafer can be polished. A roughened surface may be formed by pasting a polishing cloth on the polishing table, or a roughened surface may be formed using abrasive grains of diamond.

Next, each of the components that form the vacuum chuck according to the embodiment of the first present invention is described.

The form of the above-described sucking plate is not particularly limited, and the sucking plate may be in disc form, in the form of a disc with a brim, in the form of a plate which is elliptical in a plan view, in rectangular parallelepiped form or in cubic form. Furthermore, the sucking plate may be in a form that is a combination of the above.

The above-described sucking plate is comprised of a sucking layer made of a porous ceramic and a dense material layer. The above-described porous ceramic is not particularly limited, and nitride ceramics, such as aluminum nitride, silicon nitride, boron nitride and titanium nitride, carbide ceramics, such as silicon carbide, zirconium carbide, titanium carbide, tantalum carbide and tungsten carbide, and oxide ceramics, such as alumina, zirconia, cordierite and mullite, are exemplified, and from among these, silicon carbide which has high thermal conductivity and is excellent in resistance to chemicals such as hydrochloric acid, nitric acid, sulfuric acid, hydrofluoric acid, hydrofluoric-nitric acid and sodium hydroxide is desirable. In addition, in the case where silicon carbide is used as the porous ceramic, friction heat that is emitted at the time of polishing can be quickly released.

Here, silicon containing ceramics where a metal silicon is mixed into the above-described ceramic and ceramics combined with silicon or a silicate compound can also be used.

The above-described dense material layer is formed by impregnating the above-described porous ceramic with a metal.

The above-described metal is not particularly limited, and metal silicone, metal aluminum and the like are exemplified.

From among these, metal silicon is most desirable. This is because the functions of the dense material layer for increasing the rigidity of the sucking plate can be sufficiently gained and metal silicon has high thermal conductivity, and therefore, the dense material layer that is impregnated with metal silicon also has high thermal conductivity, and thus, heat that is emitted at the time of polishing can be quickly released.

It is desirable for the thickness of the above-described dense material layer to be about 30 to about 90% of the thickness of the above-described sucking plate.

In the case where the ratio of the thickness of the above-described dense material layer is less than about 30%, the sucking plate is not sufficiently rigid and the sucking plate warps, due to the load at the time of clamping and at the time of polishing of the object to be sucked, and thus, the polishing precision sometimes lowers. Meanwhile, when the ratio of the thickness of the dense material layer exceeds about 90%, the ratio of the sucking layer occupied in the sucking plate becomes too small, and in some cases, localized warping may occur in portions where air sucking holes are created directly beneath the holding surface.

In addition, it is generally desirable for the thickness of the above-described dense material layer to be approximately about 10 to about 40 mm.

In the vacuum chuck according to the embodiment of the first present invention, though the form of the holding surface is not particularly limited, it is desirable to be in circular form. This is because the form of the semiconductor wafer, which is the main object to be polished, is in disc form.

In the case where the holding surface of the sucking plate is in circular form, an appropriate diameter thereof is determined by taking the diameter of the semiconductor wafer, which is the object to be polished, into consideration and it is generally desirable for the diameter of the holding surface to be about 100 to about 400 mm.

It is desirable for the thermal conductivity of the porous ceramic that forms the above-described sucking plate to be about 50 W/m·K or more. This is because the sucking plate tends to have a high temperature when a polishing process is carried out on the semiconductor wafer, in this case, the sucking plate may be cooled by a coolant, and it is preferable to use a material having a high thermal conductivity in order to increase the cooling effect by this coolant.

In addition, an appropriate thickness of the sucking plate is determined by taking the thermal conductivity and the Young's modulus of the material that forms the vacuum chuck into consideration, and in the case where the above-described sucking plate is formed by silicon carbide, for example, it is desirable for the thickness to be about 15 to about 60 mm. In the case where the thickness of the sucking plate is about 15 mm or more, the thickness is not small relative to the diameter of the sucking plate, and thus, the sucking plate tends not to warp and has a lower strength, and therefore can not be easily damaged. Meanwhile, in the case where the thickness of the sucking plate is about 60 mm or less, the weight of the sucking plate does not increase, which does not lead to an increase in the size of the vacuum chuck.

Though the porosity of the above-described sucking layer (porous ceramic) is not particularly limited, it is desirable to be approximately about 20 to about 50%. In the case where the porosity is less than about 20%, the suction force for sucking the object to be sucked weakens and the object to be sucked, such as a semiconductor wafer, may move or be peeled when a polishing process, and the like, is carried out. Meanwhile, in the case where the porosity exceeds about 50%, the strength of the sucking plate is reduced and thus the sucking plate becomes easily breakable, and it becomes necessary to increase the thickness of the sucking plate in order to prevent such breakage, and then the vacuum chuck increases in size and becomes expensive.

It is desirable for the pore diameter of the sucking plate to be uniform in order to maintain even suction force of the holding surface, and it is desirable for the average pore diameter to be 10 to 40 μm when the distribution of the pores in the above-described sucking plate is measured in accordance with a mercury injection method, and it is desirable for the ratio of pores having a pore diameter of 0.7 to 1.2 times of the above-described average pore diameter to the total volume of the pores to be about 75% or more.

Here, the above-described porosity can be measured in accordance with conventionally well-known methods such as the Archimedes method, and the measurement using a scanning electron microscope (SEM) in addition to the mercury injection method.

It is preferable for the average particle diameter of the sucking plate made of the above-described porous silicon carbide to be about 30 to about 70 μm. In this manner, relatively large particles having an average particle diameter of about 30 to about 70 μm are preferable because the rate at which heat is conducted inside the particles is generally higher than the rate at which heat is conducted between particles, and therefore, the greater the average particle diameter becomes, the higher the thermal conductivity becomes, and the more easily the pore diameter becomes uniform.

It is desirable for the material of the above-described annular partition layers to be glass, a metal, a ceramic, and the like.

As for the above-described glass, glass of which the main components are $Al_2O_3$, $SiO_2$, $Na_2O$—$SiO_2$, $Na_2O$—$CaO$—$SiO_2$, $K_2O$—$CaO$—$SiO_2$, $K_2O$—$PbO$—$SiO_2$, $BaO$—$SiO_2$—$B_2O_3$ and $Na_2O$—$B_2O_3$—$SiO_2$ and the like are exemplified.

In addition, it is desirable for the above-described glass to be inorganic glass. This is because it is difficult for change in the form, such as swelling, to occur.

As for the above-described metal, SUS, aluminum, tungsten, molybdenum, nickel, gold, silver and platinum are exemplified.

As for the above-described ceramic, nitride ceramics such as aluminum nitride, silicon nitride, boron nitride and titanium nitride, carbide ceramics such as silicon carbide, zirconium carbide, titanium carbide, tantalum carbide, and tungsten carbide, and oxide ceramics such as alumina, zirconia, cordierite and mullite can be cited.

In particular, it is desirable for the Young's modulus and the coefficient of thermal expansion of the material of the above-described annular partition layer to be almost the same as the Young's modulus and the coefficient of thermal expansion of the porous ceramic that forms the sucking plate.

In addition, the vacuum chuck according to the embodiment of the first present invention has a holder for holding the above-described sucking plate, and a vacuum apparatus and the like is generally connected to this holder. The above-described holder has an air sucking portion in a certain form and the material thereof is not particularly limited as long as it forms a dense body having a mechanical strength at a certain level or higher, and as for the material thereof, metals such as SUS, copper and aluminum alloys, and ceramics such as silicon nitride, silicon carbide, and alumina, are exemplified.

In addition, as the above-described vacuum apparatus, an ejector and the like can be cited in addition to a vacuum pump.

Here, the method for manufacturing a vacuum chuck having such a configuration will be described in the following.

In addition, in vacuum chuck according to the embodiment of the first present invention, as a form of attaching it to the holder is not limited to the form shown in FIG. 4, and may be for example, the form shown in FIG. 5.

Figure 5A:
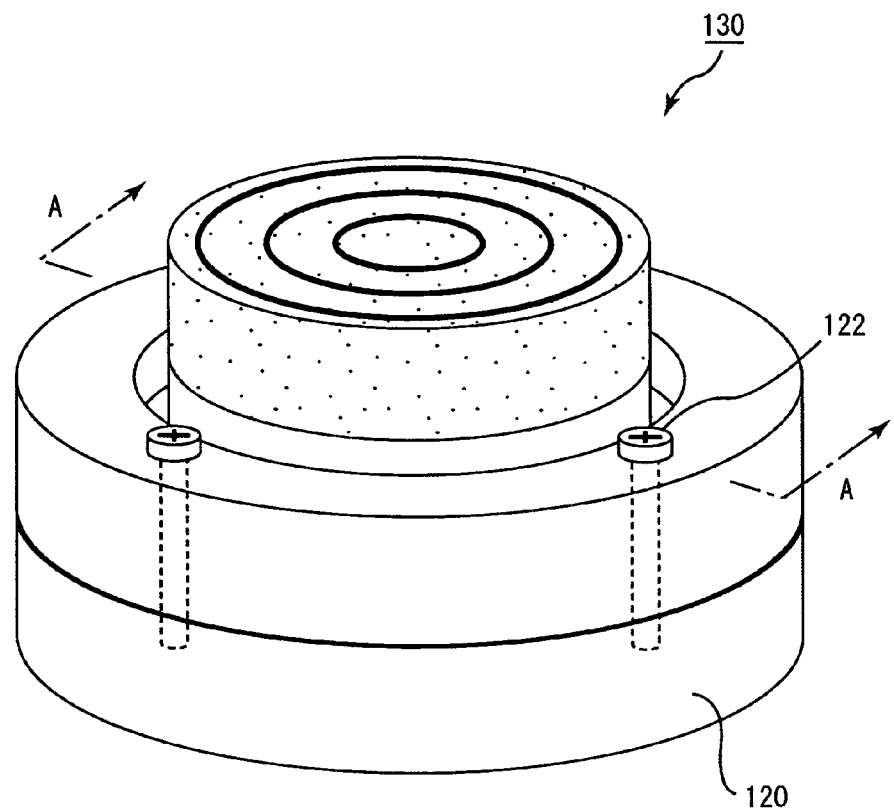
FIG. 5A is a perspective view schematically showing another example of a vacuum chuck according to the embodiment of the first present invention.
Figure 5B:
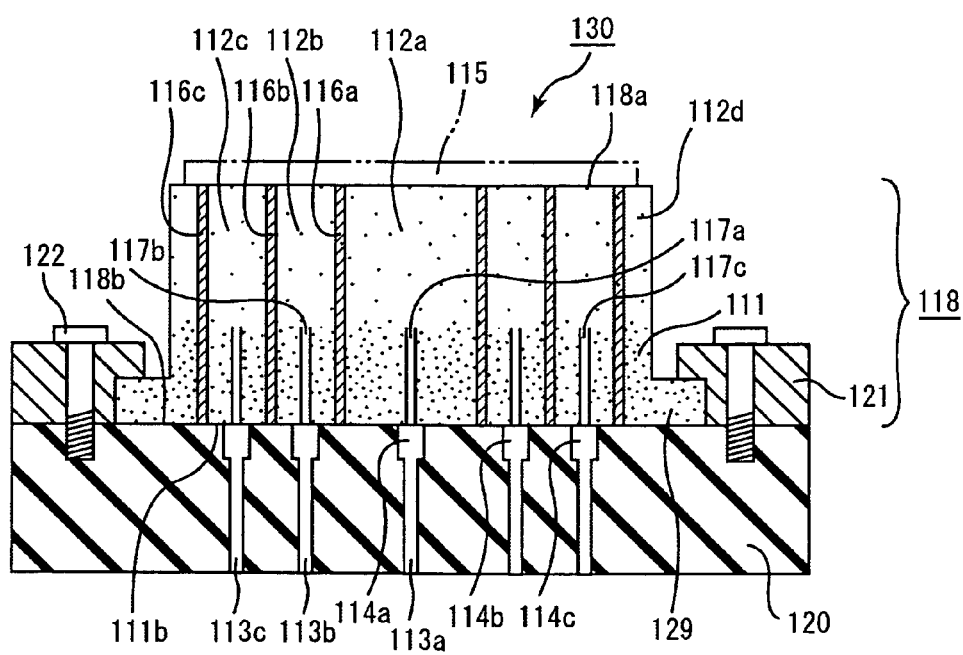
FIG. 5B is an A-A line cross-sectional view of FIG. 5A.

FIG. 5A is a perspective view schematically showing another example of a vacuum chuck according to the embodiment of the first present invention, and FIG. 5B is an A-A line cross-sectional view of FIG. 5A.

As shown in FIGS. 5A and 5B, in a vacuum chuck 130, according to the embodiment of the first present invention, a brim portion 129 of a sucking plate 118 is sandwiched between a jig for fixture 121 and a holder 120, and the jig for fixture 121 is secured to the holder 120 with four bolts 122, and thereby, the sucking plate 118 is attached to the holder.

Here, the vacuum chuck 130 is the same as the vacuum chuck 110, except that the method for fixing the sucking plate 118 to the holder 120 is different from that of the vacuum chuck 110 shown in FIG. 4, and therefore, the descriptions thereof are omitted.

Next, the method for manufacturing a vacuum chuck according to the embodiment of the first present invention is briefly described.

Here, this manufacturing method is described using a vacuum chuck which can suck an object to be sucked, having different sizes, and where annular partition layers are formed as an example.

In the manufacture of a vacuum chuck as described above, a member for a sucking plate in disc form comprised of generally a sucking layer and a dense material layer, and members for a sucking plate in doughnut form (including the form of a doughnut with a brim, hereinafter referred to in the same manner) are separately manufactured and these members are fitted by interposing annular partition layers.

Here, the member for a sucking plate in disc form and the members for sucking plate in doughnut form can be manufactured in accordance with the same method except that dice having different forms are used. Accordingly, in the following detailed description of a manufacturing method, the method for manufacturing the two is not particularly differentiated from each other, and a method for manufacturing a member for a sucking plate is merely described.

(1) Manufacturing of Member for Sucking Plate

First, a binder and a dispersion medium are added to a ceramic powder so that a mixed composite for the formation of a sucking layer is prepared, and a carbon source is added to this mixed composite, if necessary, so that a mixed composite for the formation of a dense material layer is prepared. Here, a carbon source becomes necessary in the case where a dense material layer is formed by impregnating a porous ceramic with metal silicon.

It is desirable for the variation of the average particle diameter to be small in the above-described ceramic powder, and thus, it is desirable to make the particle diameters of the powder uniform to a certain degree in advance. This is because, in the case where the variation in the average particle diameter of the ceramic powder is great, there may be a variation in the pore diameter of the member for a sucking plate to be manufactured. The method for making the particle diameter of the above-described ceramic powder uniform is not particularly limited, and well known methods, for example a method for molding a ceramic powder into a certain agglomerate having a high density, and after that, crushing and pulverizing this agglomerate into particles which are then granulated can be used.

It is desirable for the above-described ceramic powder to be adjusted so that the ratio of the ceramic powder, having a particle diameter of 0.7 to 1.2 times of the average particle diameter, to the total ceramic powder is about 75% or more.

It is desirable in the above-described ceramic powder for about 10 to about 100 parts by weight of a fine powder having an average particle diameter of about 0.1 to about 1.0 μm to be uniformly mixed with 100 parts by weight of a coarse powder having an average particle diameter of about 5 to about 100 μm.

The above-described binder is not particularly limited and methyl cellulose, carboxymethyl cellulose, hydroxyethyl cellulose, polyethylene glycol, phenol resins and epoxy resins are exemplified.

It is generally desirable for the amount of the above-described binder mixed in to be about 1 to about 10 parts by weight relative to 100 parts by weight of the ceramic powder.

The above-described dispersion medium is not particularly limited and organic solvents such as benzene, alcohols such as methanol and water are exemplified.

An appropriate amount of the above-described dispersion medium is mixed so that the viscosity of the mixed composite falls within a certain range.

As for the above-described carbon source, phenol resins, carbon black, acetylene black, pitch and tar are exemplified.

It is desirable for the amount of the above-described carbon source mixed in to be about 1 to about 10 parts by weight relative to 100 parts by weight of the ceramic powder.

Each of the mixed composite for the formation of a sucking layer and the mixed composite for the formation of a dense material layer is mixed in an atritor, and after that, sufficiently kneaded in an kneader, and furthermore, converted to a powder in granular form in accordance with a spray dry method and the like.

In addition, a raw molded body is manufactured by placing this mixed composite for the formation of a dense material layer in the granular form into the lower portion of a die in a certain form (disc form or doughnut form), by placing the mixed composite for the formation of a sucking layer in granular form into the upper portion of the die and by molding them. Here, the amounts of the mixed composite for the formation of a dense material layer and the mixed composite for the formation of a sucking layer are appropriately adjusted, and thereby, the ratio of the thickness occupied by the dense material layer in the sucking plate gained through the subsequent process can be adjusted.

Next, the raw molded body is heated to about 400 to about 650° C. under an atmosphere of an inert gas (argon), to be degreased, and thereby, the binder is decomposed and evaporated.

Then, after the above-described degreasing process has been carried out, the raw molded body is heated to about 1400 to about 2300° C. under an inert gas atmosphere such as nitrogen or argon, so as to be fired, and thus, the ceramic powder is sintered, and furthermore, the sintered ceramic is processed into a certain form, and thereby, a sintered body for a sucking plate is manufactured.

The sintered body can be processed through cutting using a diamond cutter and grinding using a diamond grinding stone.

Next, a metal impregnating process for impregnating the above-described sintered body for a sucking plate with a metal is carried out.

In the case where the sintered body is impregnated with, for example, metal silicone in this process, the sintered body may have been impregnated with a carbon-based material in advance.

As for the above-described carbon-based material, a variety of organic materials such as furfural resins, phenol resins, lignin sulfonate, polyvinyl alcohol, cornstarch, molasses, coal tar pitch and alginate are exemplified. In addition, pyrolytic carbon such as carbon black and acetylene black can be used in the same manner.

The reason why it is desirable to impregnated the sintered body with a carbon-based material in advance in this manner is that a silicon carbide film is newly formed on the surface of open pores of the sintered body and thereby, the bonding between the melted metal silicone and the porous body is further strengthened. In addition, the strength of the sintered body is increased through the impregnation with the carbon-based material.

As for the specific method for impregnation with metal, a method for impregnation with metal that has been heated and melted can be cited as an example. In addition, a method for dispersing a metal that has been converted to a find powder in a dispersion medium, impregnating a porous body with this dispersion medium and drying the porous body, and after that, heating the porous body to the melting temperature of the metal or higher can also be used.

Such a process is carried out, and thereby, members for a sucking plate in disk form or in doughnut form comprised of a sucking layer and a dense material layer can respectively be manufactured.

Here, it is desirable for the difference in the dimensions between the diameter of the member for a sucking plate in disk form and the inner diameter of the member for a sucking plate in doughnut form, which are made to make contact with by interposing an annular partition layer in the subsequent process, between the outer diameter of a member for a sucking plate in doughnut form and the inner diameter of another member for a sucking plate in doughnut form, which are made to make contact with by interposing an annular partition layer in the subsequent process as well as between the outer diameter of the member for a sucking plate in doughnut form and the inner diameter of the member for a sucking plate in the form of a doughnut with a brim, which are made to make contact with by interposing an annular partition layer in the subsequent process, to be about 0.2 to about 2.0 mm in the design. As a result, annular partition layers having a thickness of about 0.1 to about 1.0 mm can be formed through the subsequent process.

(2) Manufacturing of Sucking Plate

Next, glass that has been converted to paste in advance is prepared and this is applied to the sides of the member for a sucking plate in disk form and the members for sucking plate in doughnut form. After that, the member for a sucking plate in disk form, the members for sucking plate in doughnut form and the member for sucking plate in the form of a doughnut with a brim are assembled into the form shown in FIG. 4, and furthermore, the applied glass in paste form is melted at about 500 to about 1200° C. under an oxygen atmosphere before being hardened, and thus, the annular partition layers are formed.

Next, air sucking holes are created through drill processing or cutting processing so as to pass through at least the dense material layer of the sucking plate where the annular partition layers are formed, and furthermore, a finishing process is carried out and the manufacture of a sucking plate is completed.

Here, the creation of air sucking holes may be carried out before the assembly of the members for a sucking plate or may be carried out before impregnation with metal.

In addition, it is desirable for the degree of flatness of the holding surface to be about 5 µm or less in the finishing process. In addition, it is also desirable for the difference in height between the portions made of the sucking layers on the holding surface and the portions made of the annular partition layers on the holding surface to be about 0.5 µm or less.

The above-described finishing process can be carried out through cutting using a diamond cutter, grinding using a diamond grinding stone and polishing using diamond abrasive grains.

The method for manufacturing a sucking plate made of a porous ceramic is not limited to the above-described method and a variety of conventional methods which have been used for the manufacture of ceramics can be applied.

Next, an air impermeable layer is formed on the side of the sucking plate if necessary. Here, the air impermeable layer can be formed in the same manner as the annular partition layers by applying glass in paste form, and after that curing the glass.

Furthermore, the sucking plate that has been manufactured through the above-described process is secured to a holder which is connected to a vacuum apparatus such as a vacuum pump using bolts and the like.

The vacuum chuck according to the embodiment of the first present invention can be manufactured through the above-described process.

In the vacuum chuck according to the embodiment of the first present invention, the sucking layer and the dense material layer of the sucking plate are integrated, and no junction portion exists between them.

Therefore, there are no disadvantages in terms of inconsistency in the junction or shifting in the joined portion between the two, which would be a problem in the case where a porous ceramic and a dense ceramic are joined together, and therefore, this vacuum chuck has excellent precision in grinding/polishing when used for a grinding/polishing process.

In addition, the dense material layer is formed through impregnation with a metal, and therefore, has excellent thermal conductivity, and thus, heat that is emitted at the time of polishing can be quickly released.

Furthermore, as described above, no joined portion exists between the sucking layer and the dense material layer, and therefore, thermal conductivity is not prevented in the interface between the sucking layer and the dense material layer, and thus, heat that is emitted at the time of polishing can be quickly released.

In addition, in the vacuum chuck according to the embodiment of the first present invention, in the case where one or more of an annular partition layer(s) for blocking permeation of air are formed in the above-described sucking layer and the outer edge of the above-described annular partition layer is configured to be located in a region of about 0.5 to about 15 mm inside the outer edge of the above-described object to be sucked, object to be sucked of a variety of sizes can be sucked without fail, and object to be sucked of a variety of sizes can be uniformly polished, ground and the like.

In addition, in the vacuum chuck according to the embodiment of the first present invention, in the case where the thickness of the above-described annular partition layer is about 0.1 to about 1.0 mm, air can be blocked without fail, and there is no risk that the form of the annular partition layer exposed from the holding surface may be transferred to the object to be sucked.

In addition, in the vacuum chuck according to the embodiment of the first present invention, in the case where the Young's modulus and the coefficient of thermal expansion of the above-described annular partition layer that form the sucking plate are almost the same as the Young's modulus and the coefficient of thermal expansion of the porous ceramic, the ease of grinding of the annular partition layer and the porous ceramic is almost the same, and therefore, the degree of flatness of the holding surface becomes particularly excellent.

Next, the vacuum chuck according to the embodiment of the second present invention is described.

The vacuum chuck according to the embodiment of the second present invention is provided with a sucking plate for sucking and holding an object to be sucked which is comprised of a sucking layer made of at least porous ceramic and an annular partition layer for blocking permeation of air, wherein the above-described annular partition layer is formed by glass with which a nonoxide-based ceramic powder is mixed therein.

In the following, the vacuum chuck according to the embodiment of the second present invention is described in reference to the drawings.

Figure 6A:
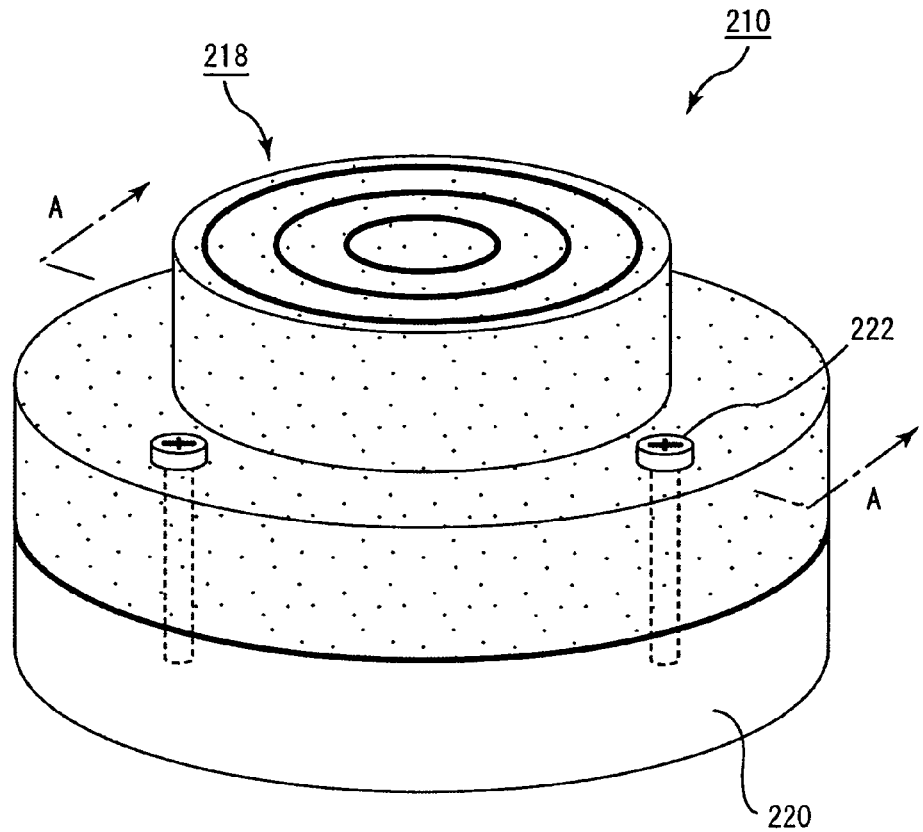
FIG. 6A is a perspective view schematically showing an example of a vacuum chuck according to the embodiment of the second present invention.
Figure 6B:
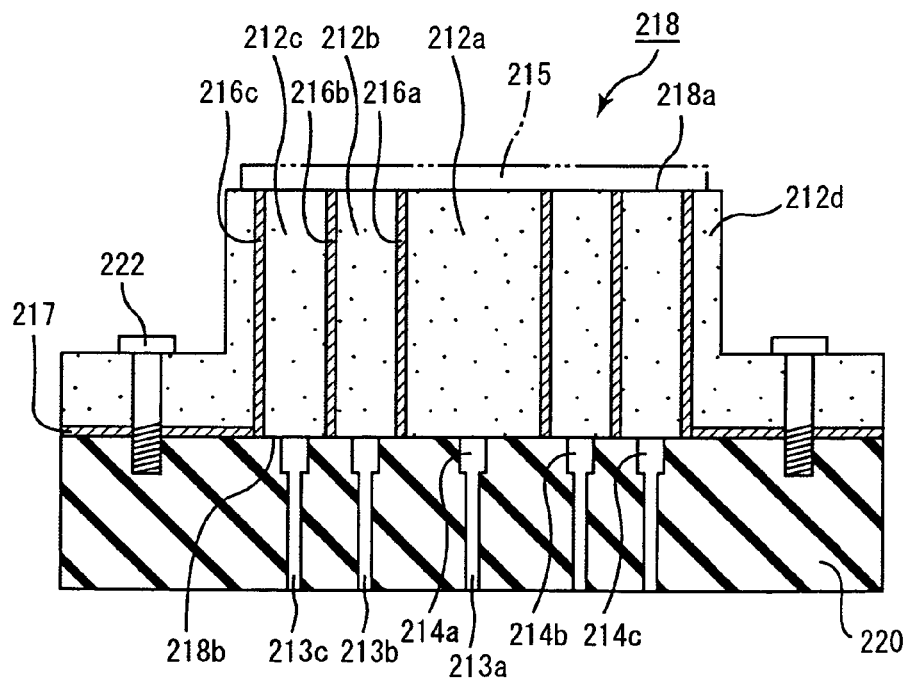
FIG. 6B is an A-A line cross-sectional view of FIG. 6A.

FIG. 6A is a perspective view schematically showing an example of a vacuum chuck according to the embodiment of the second present invention, and FIG. 6B is an A-A line cross-sectional view of FIG. 6A.

As shown in FIGS. 6A and 6B, a vacuum chuck 210 is provided with a sucking plate 218 made of suction portions 212a to 212d through which air permeates and annular partition layers 216a to 216c for blocking permeation of air. The sucking plate 218 has a holding surface 218a for sucking and holding a semiconductor wafer (object to be sucked) 215, and a sucking surface 218b for sucking air from the surface opposite to the holding surface 218a. In addition, the sucking plate 218 has a form (form of a disc with a brim) where two discs having different diameters are layered and integrated.

Here, the holding surface 218a and the sucking surface 218b are formed in each of the suction portions 212a to 212d and the entire portion from the holding surface to the sucking surface is continuously formed by a porous ceramic. In addition, annular partition layers 216a to 216c are formed in annular form and are concentric with the sucking plate 218.

The annular partition layers 216a to 216c are formed by glass with which a nonoxide-based ceramic powder is mixed therein.

Here, the suction portion 212d in the form of a doughnut with a brim which forms the sucking plate 218 does not have a function of sucking an object to be sucked, and therefore, does not essentially correspond to a suction portion. However, this is made of a porous ceramic in the same manner as other suction portions 212a to 212c which have a function of sucking an object to be sucked, and therefore, is referred to as suction portion 212d for the purpose of convenience.

In addition, a holder 220 of which the air sucking portions are connected to a vacuum apparatus such as a vacuum pump, not shown, is secured to the lower portion of the sucking plate 218 using four bolts which are set at equal intervals. Here, the number of bolts is not limited to four, and the number is generally approximately 4 to 12.

In addition, the holder 220 is provided with air sucking portions 213a to 213c where grooves 214a to 214c are created in the portions which make contact with the sucking surface 218b of the sucking plate 218.

In addition, an air impermeable layer 217 is formed in the portion on the lower surface of the sucking plate, located outside the outermost annular partition layer 216c. Here, the air impermeable layer 217 is not necessarily formed, but may be formed if necessary.

Accordingly, the vacuum chuck 210 is configured so as to suck out air from the inside of the suction portions 212a to 212c through the air sucking portion 213a to 213c using a vacuum pump (not shown).

The vacuum chuck 210 according to such an embodiment can suck out air from the inside of the suction portions 212a to 212c made of a porous ceramic through the air sucking portion 213a to 213c using a vacuum pump (not shown) so as to suck and hold an object to be sucked.

Furthermore, the object to be sucked such as semiconductor wafers having a portion to be sucked, of different sizes can be sucked by selecting appropriate suction portions from the inside of which air is sucked out. Specifically, in the case where an object to be sucked of which the size of the portion to be sucked in a plan view is slightly greater than the size of the outermost annular partition layer 216c is sucked, the vacuum pump is operated so as to suck out air from all of the air sucking portions 213a to 213c, and thereby, the object to be sucked is sucked. In the case where an object to be sucked of which the size of the portion to be sucked in a plan view is slightly greater than the size of the annular partition layer 216b in a plan view is sucked, air is sucked out from the air sucking portions 213a and 213b, and thereby, the object to be sucked is sucked. In the case where an object to be sucked of which the size in a plan view is slightly greater than the size of the annular partition layer 216a in a plan view is sucked, air is sucked out only from the air sucking portion 213a, and thereby, the object to be sucked is sucked.

In the vacuum chuck according to the embodiment of the second present invention, the number of the annular partition layers which are formed in the sucking plate is not limited to three as shown in FIG. 6, and in the case where two types of semiconductor wafers having different sizes in the portion to be sucked are sucked, at least two annular partition layers need to be formed and in the case where three or more types of semiconductor wafers having difference sizes in the portion to be sucked are sucked, at least three annular partition layers need to be formed.

In addition, in the case where the size of the object to be sucked is the same, one annular partition layer needs to be formed and in this case, the annular partition layer may be formed only on the side of the suction portion.

In the vacuum chuck according to the embodiment of the second present invention, in the case where the sucking plate is comprised of at least two suction portions and at least two annular partition layers, the vacuum chuck functions in such a manner that it is possible to suck and hold object to be sucked having different sizes without fail.

In the vacuum chuck according to the embodiment of the second present invention, it is desirable for the outer edge of each annular partition layer to be located in a region of about 0.5 to about 15 mm inside the outer edge of the object to be sucked 215, and in addition, it is desirable for the thickness of the above-described annular partition layer to be about 0.1 to about 1.0 mm. The reasons for these are the same as in the vacuum chuck according to the embodiment of the first present invention.

Accordingly, in the case where the annular partition layers are in annular form, and the object to be sucked, such as a silicon wafer is in a disk form in the same manner as according the vacuum chuck according to the embodiment of the first present invention, it is desirable for the diameter (outer diameter) of the annular partition layer in a plan view to be smaller than the diameter of the object to be sucked by about 0.5 to about 15 mm.

In addition, in the vacuum chuck 210 according to the embodiment of the second present invention, it is desirable for the degree of flatness of the holding surface 218a of the sucking plate 218 to be about 5 μm or less. The reason for this is the same as the vacuum chuck according to the embodiment of the first present invention.

In addition, in the vacuum chuck 210 according to the embodiment of the second present invention, it is desirable for the difference in height between the portions made of suction portions on the holding surface 218a of the sucking plate 218 and the portion made of the above-described annular partition layers to be about 0.5 μm or less. The reason for this is the same as in the vacuum chuck according to the embodiment of the first present invention.

In addition, it is desirable for the Young's modulus and the coefficient of thermal expansion of the annular partition layers 216a and 216b which form the sucking plate 18 to be almost the same as the Young's modulus and the coefficient of thermal expansion of the suction portions 212a to 212d (porous ceramic) that form the sucking plate 218 in the vacuum chuck 210. The reason for this is the same as in the vacuum chuck according to the embodiment of the first present invention.

In the vacuum chuck 210, air is sucked out through air sucking portions 213a to 213c using a vacuum pump (not shown), and thereby, a semiconductor wafer 215 which is placed on the holding surface 218a of the sucking plate 218 can be sucked and held. Here, the vacuum chuck 210 may be provided with a rotational mechanism which allows rotation around the center axis of the sucking plate as the center.

Here, though no grooves or holes are created in the sucking plate 218 shown in FIG. 6, grooves or holes in various forms may be created in, for example, the sucking surface 218b in order to increase the suction speed.

In the case where a grinding or polishing process, for example, is carried out using the vacuum chuck 210, a grinding stone is rotated, and at the same time the vacuum chuck 210 is rotated in a state where the object to be sucked, such as a semiconductor wafer, and the axis of the grinding stone are parallel to each other, and then the two are made to make contact with each other, and thereby, the surface of the semiconductor wafer and the like can be ground.

In addition, a polishing table having a polishing surface is rotated, the vacuum chuck 210 itself is rotated or the two are rotated in a state where the polishing table having a polishing surface and the object to be sucked, such as a semiconductor wafer, which is sucked on the holding surface are parallel to each other, and then the two are made to make contact with each other, and thereby, the surface of the semiconductor wafer can be polished. In the polishing table, the roughened surface may be formed by pasting an abrasive cloth to a table or the roughened surface may be formed using diamond abrasive grains.

Next, each of the members that form the vacuum chuck according to the embodiment of the second present invention is described.

The form of the above-described sucking plate is not particularly limited, and the same forms for the sucking plate that forms the vacuum chuck according to the embodiment of the first present invention can be cited.

Though the form of the holding surface of the above-described vacuum chuck is not particularly limited, it is desirable to be a circular form. This is because the form of the semiconductor wafer which is the main object to be polished is a disk form.

In the case where the holding surface of the sucking plate is in a circular form, an appropriate diameter is determined by taking the diameter of the semiconductor wafer which is the object to be polished into consideration, and it is generally desirable for the diameter to be about 100 to about 400 mm.

In addition, an appropriate thickness of the sucking plate is determined by taking the thermal conductivity and the Young's modulus of the materials that form the vacuum chuck into consideration, and in the case where the above-described sucking plate is formed by silicon carbide, for example, it is desirable for the thickness to be about 5 to about 60 mm. In the case where the thickness of the sucking plate is about 5 mm or more, the sucking plate is not thin relative to the diameter, and the sucking plate tends not to warp and have a low strength, and thus, is not easily damaged. Meanwhile, in the case where the thickness of the sucking plate is about 60 mm or less, the sucking plate does not become heavy and the vacuum chuck does not increase in size.

The above-described porous ceramic is not particularly limited, and the same porous ceramics as those that form the sucking plate of the vacuum chuck according to the embodiment of the first present invention are exemplified.

In addition, it is desirable for the thermal conductivity and the porosity of the above-described porous ceramic to be about 50 W/m·K or more and about 20 to about 50%, respectively, for the same reasons as in the vacuum chuck according to the embodiment of the first present invention.

In addition, it is desirable for the pore diameter of the sucking plate to be uniform, so that the suction force of the holding surface can be kept uniform, and when the pore distribution in the above-described sucking plate is measured in accordance with a mercury injection method, it is desirable for the average pore diameter to be 10 to 40 μm, for the ratio of pores having a pore diameter of 0.7 to 1.2 times of the above-described average pore diameter to the total volume of the pores to be about 75% or more, for the ratio of pores having a pore diameter of less than 10 μm to the total volume of the pores to be about 15% or less, and for the ratio of pores having a pore diameter which exceeds 40 μm to the total volume of the pores to be about 10% or less.

It is preferable for the average particle diameter in the sucking plate made of the above-described porous silicon carbide to be about 30 to about 70 μm. The reason for this is the same as with the vacuum chuck according to the embodiment of the first present invention.

The above-described annular partition layers are formed by glass with which a nonoxide-based ceramic powder is mixed therein.

As the above-described glass, glass of which the main components are $Al_2O_3$, $SiO_2$, $Na_2O$—$SiO_2$, $Na_2O$—$CaO$—$SiO_2$, $K_2O$—$CaO$—$SiO_2$, $K_2O$—$PbO$—$SiO_2$, $BaO$—$SiO_2$—$B_2O_3$ and $Na_2O$—$B_2O_3$—$SiO_2$ are exemplified. In addition, it is desirable for the above-described glass to be inorganic glass. This is because it is difficult for change in the form, such as swelling, to occur.

As for the above-described nonoxide-based ceramic powder, powders of nitride ceramics such as aluminum nitride, silicon nitride, boron nitride and titanium nitride, and carbide ceramics such as silicon carbide, zirconium carbide, titanium carbide, tantalum carbide and tungsten carbide are exemplified.

Though the amount of the above-described nonoxide-based ceramic powder mixed in is not particularly limited, it is desirable for about 50 to about 150 parts by weight to be mixed with 100 parts by weight of the glass component.

This is because in the case of about 50 parts by weight or more, the thermal conductivity is sufficiently increased, and the object to be sucked tends not to warp due to friction heat at the time of polishing, while in the case of about 150 parts by weight or less, gaps are not easily created in the annular partition layers, and therefore, the strength of joining between the sucking layers and the annular partition layers becomes sufficient and the annular partition layers may not be broken when clamped or due to the load at the time of processing.

It is desirable for about 100 parts by weight of the above-described nonoxide-based ceramic powder to be mixed with 100 parts by weight of the glass component.

It is desirable for the average particle diameter of the above-described nonoxide-based ceramic powder to be about 0.5 to about 20 μm. This is because in the case where the above-described average particle diameter is about 0.5 μm or more, the thermal conductivity is sufficiently increased, and the object to be sucked tends not to warp due to friction heat at the time of polishing, while in the case where the average particle diameter is about 20 μm or less, gaps are not easily created in the annular partition layers, and therefore, the strength of joining between the sucking layers and the annular partition layers becomes sufficient and the annular partition layers may not be broken when clamped or due to the load at the time of processing.

It is desirable for the combination of the glass and the nonoxide-based ceramic powder to be a combination of borosilicate glass and silicon carbide powder. This is because the two have almost the same coefficient of thermal expansion, and therefore, there is no difference in the coefficient of thermal expansion causing cracking in the annular partition layers. In addition, the above-described combination has excellent resistance to chemicals and is not changed in quality by the grinding liquid and washing liquid used at the time of processing.

In addition, it is desirable for the Young's modulus and the coefficient of thermal expansion of the materials for the above-described annular partition layers to be almost the same as the Young's modulus and the coefficient of thermal expansion of the porous ceramic which forms the sucking plate.

Accordingly, it is desirable for the porous ceramic and the nonoxide-based ceramic powder to have almost the same Young's modulus and coefficient of thermal expansion, and therefore, it is desirable for the two to be the same material. This is because it is appropriate to make the Young's modulus and the coefficient of thermal expansion almost the same between the porous ceramic and the annular partition layers.

In addition, the vacuum chuck according to the embodiment of the second present invention is provided with a holder for holding the above-described sucking plate and a vacuum apparatus and the like is generally connected to this holder. The form and material of the above-described holder, the above-described vacuum apparatus and the like are the same as those for the vacuum chuck according to the embodiment of the first present invention.

The method for manufacturing a vacuum chuck having such a configuration will be described in the following.

In addition, the embodiments of the vacuum chuck according to the embodiment of the second present invention are not limited to the embodiments shown in FIG. 6, and, for example, an embodiment as that shown in FIG. 7 may be included.

Figure 7A:
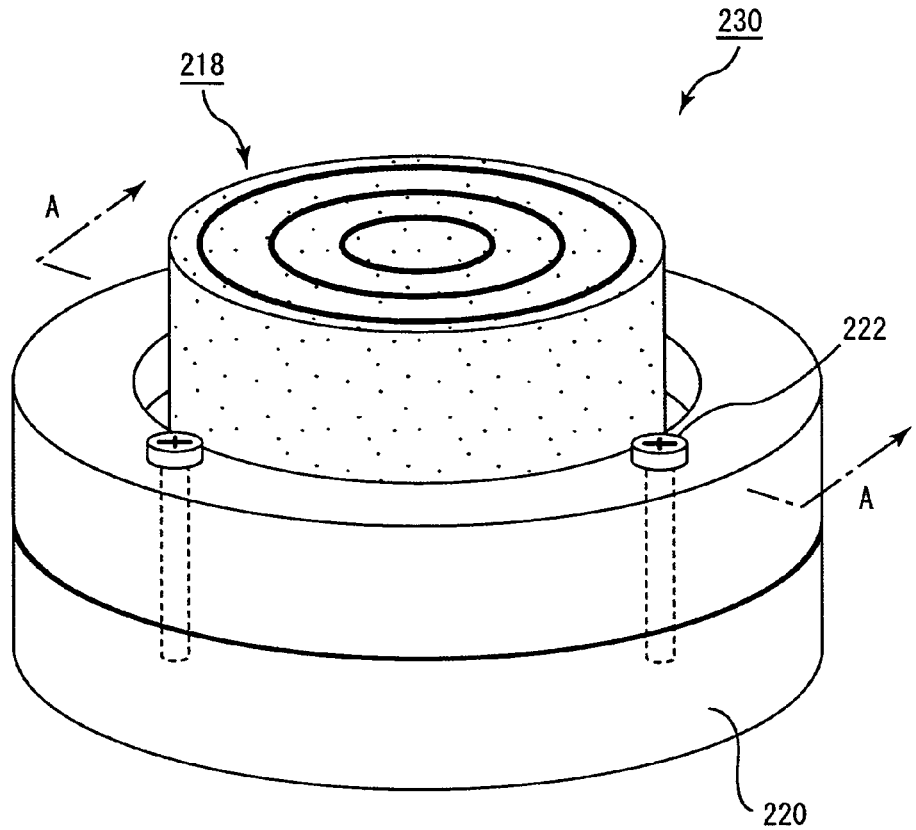
FIG. 7A is a perspective view schematically showing another example of a vacuum chuck according to the embodiment of the second present invention.
Figure 7B:
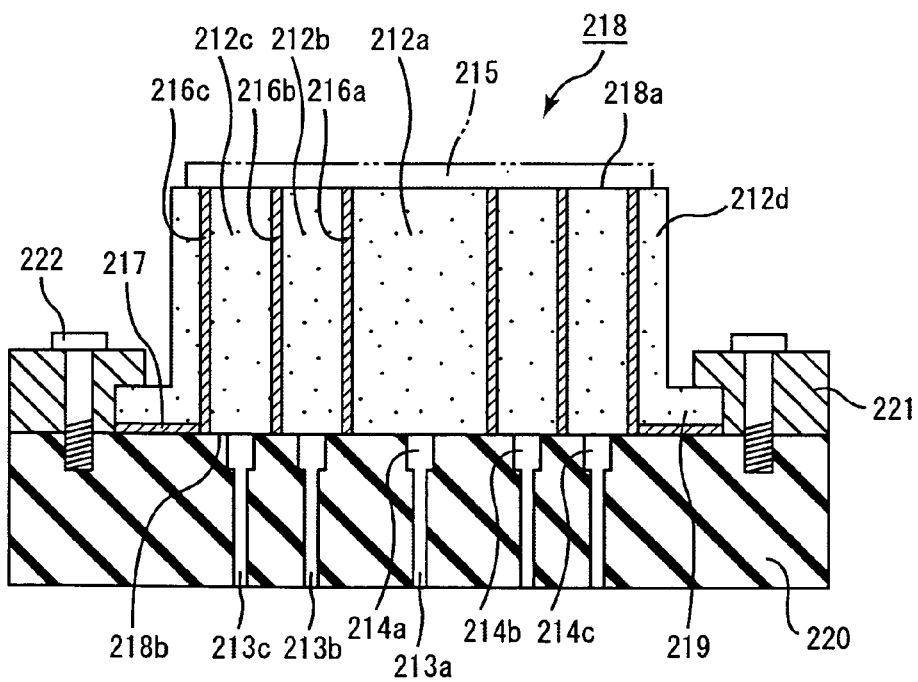
FIG. 7B is an A-A line cross-sectional view A-A of FIG. 7A.

FIG. 7A is a perspective view schematically showing another example of a vacuum chuck according to the embodiment of the second present invention, and FIG. 7B is an A-A line cross-sectional view of FIG. 7A.

As shown in FIGS. 7A and 7B, in a vacuum chuck 230 according to the embodiment of the second present invention, a brim portion 219 of a sucking plate 218 is sandwiched between a jig for fixture 221 and a holder 220, and the jig for fixture 221 is secured to the holder 220 with four bolts 222, and thereby, the sucking plate 218 is attached to the holder.

Here, the vacuum chuck 230 is the same as the vacuum chuck 210, except that the method for securing the sucking plate 218 to the holder 220 is different from that for the vacuum chuck 210 shown in FIG. 6, and therefore, the description thereof is omitted.

Furthermore, the form of the vacuum chuck according to the embodiment of the second present invention may be a form as shown in FIG. 4, which is referred to for the description of the vacuum chuck according to the embodiment of the first present invention, and in this case, the annular partition layers may be formed by glass with which a nonoxide-based ceramic powder is mixed therein.

In addition, the vacuum chuck according to the embodiment of the second present invention may have a form as shown in FIG. 4, where an additional annular partition layer may be formed in a portion on the side of the sucking layer 112*d*. As a result, the polishing liquid and the grinding liquid can be prevented from penetrating.

The number of annular partition layers formed in the sucking plate in the vacuum chuck according to the embodiment of the second present invention having a form as shown in FIG. 4 is not limited to three, and an appropriate number can be selected in accordance with the size and type of the object to be sucked.

In addition, in the case where the size of the object to be sucked is the same, one annular partition layer may be formed, and in this case, it is possible to form the annular partition layer only on the side of the sucking layer.

It is desirable for the vacuum chuck according to the embodiment of the second present invention having a form as shown in FIG. 4 to be formed so that the outer edge of each of the annular partition layers is located in a region about 0.5 to about 15 mm inside the outer edge of the object to be sucked. The reason for this is the same as that described above.

In addition, desirable values for the thickness of the annular partition layers, the degree of flatness of the holding surface of the sucking plate and the difference in height between the portions made of the sucking layers on the holding surface and the portions made of the annular partition layers are the same those already described.

In addition, the dense material layer that forms the vacuum chuck having a form as shown in FIG. 4 is the same as that of the vacuum chuck according to the embodiment of the first present invention described above.

Next, a method for manufacturing a vacuum chuck according to the embodiment of the second present invention is briefly described.

Here, the manufacturing method is described using as an example a vacuum chuck where annular partition layers are formed so that an object to be sucked of different sizes can be sucked.

First, a method for manufacturing a vacuum chuck according to the embodiments shown in FIGS. 6 and 7, that is to say, a vacuum chuck where the entire portion from the holding surface of the sucking plate to the sucking surface is continuously formed by a porous ceramic (hereinafter referred to as a method for manufacturing all-porous ceramic type) is described.

First, a suction portion in disc form and suction portions in doughnut form, made of a porous ceramic, are manufactured. In order to manufacture the suction portions, a binder and a dispersion medium area added to a ceramic powder, and a mixed composite is prepared.

The above-described mixed composite is the same as the mixed composite for the formation of the sucking layer described in the embodiment of the first present invention.

After that, a powder in granular form made of this mixed composite is manufactured, and furthermore, manufacturing of a raw molded body, degreasing, sintering and processing are carried out in accordance with the same method as in the embodiment of the first present invention, and thereby, members for the suction material in disc form and doughnut form are manufactured.

Here, in the design, it is desirable for the difference in dimension between the diameter of the member for the suction material in disc form and the inner diameter of the member for the suction material in doughnut form which make contact by interposing an annular partition layer, between the outer diameter and the inner diameter of each of members for suction material in doughnut form which make contact by interposing an annular partition layer, and between the outer diameter of a member for suction material in doughnut form and the inner diameter of the member for suction material in the form of a doughnut with a brim which make contact by interposing an annular partition layer to be about 0.2 to about 2.0 mm, as in the embodiment of the first present invention.

Next, a nonoxide-based ceramic powder is mixed with glass which is then converted to paste, thereby, preparing glass in advance, and this is applied to the side of the member for the suction material in disc form and the sides of the members for the suction member in doughnut form. After that, the member for the suction material in disc form and the members for the suction material in doughnut form are assembled into the form shown in FIG. 6, and furthermore, the glass in paste form with which a nonoxide-based ceramic powder is mixed therein and which has been applied to the sides is melted under an oxygen atmosphere at about 500 to about 1200° C. before being hardened, and thus, annular partition layers are formed.

Next, a finishing process is carried out on the sucking plate where the finishing partition layers are formed, and thus, manufacturing of a sucking plate composed of suction portions and annular partition layers is completed.

It is desirable in this finishing process for the degree of flatness of the holding surface to be about 5 µm or less. In addition, it is also desirable for the difference in height between the portions made of the suction portions on the holding surface and the portions made of the annular partition layers on the holding surface to be about 0.5 µm or less.

The above-described finishing process can be carried out through cutting using a diamond cutter, grinding using a diamond grinding stone, and polishing using diamond abrasive grains.

The method for manufacturing a sucking plate described above is not limited to the above-described method, and a variety of conventional methods used to manufacture ceramics can be used.

Next, an air impermeable layer is formed on the lower surface of the suction portion, located outside the outermost annular partition layer if necessary. Here, the air impermeable layer can be formed by applying glass in paste form, and after that curing the glass, in the same manner as with the annular partition layers.

Furthermore, the sucking plate that has bee manufactured through the above-described process is secured to a holder which is connected to a vacuum apparatus, such as a vacuum pump, with bolts.

The vacuum chuck according to the embodiment of the second present invention can be manufactured through the process described above.

In addition, a method for manufacturing a vacuum chuck having the form described in reference to FIG. 4, that is to say, a vacuum chuck having a sucking plate where the sucking layer and the dense material layer are integrated, will be described in the following.

A vacuum chuck having this form can be manufactured by separately preparing a member for the sucking plate in disc form, and members for the sucking plate in doughnut form, that are made of the sucking layer and the dense material layer, and fitting these by interposing annular partition layers.

The above-described member for the sucking plate in disc form made of a sucking layer and a dense material layer can be manufactured in accordance with the same method as in the embodiment of the first present invention.

In addition, the members for the sucking plate are assembled and the annular partition layers are formed in accordance with the method already described, and then, air sucking holes are created so as to pass through at least the dense material layer, and finally a finishing process is carried out, and thereby, a vacuum chuck having the form shown in FIG. 4 is manufactured. The above-described air sucking holes can be created through drill processing or cutting processing. In addition, the air sucking holes can be created prior to the assembly of the members for the sucking plate.

In the vacuum chuck according to the embodiment of the second present invention, the annular partition layer for blocking permeation of air are formed by glass with which a nonoxide-based ceramic powder is mixed therein, and therefore, it is difficult for a difference in height to be created on the holding surface at the time of processing, and the form of the annular partition layer does not change due to swelling and the like at the time of processing of a wafer, and thus, high precision can be maintained on the holding surface, and the object to be sucked, such as a silicon wafer, can be uniformly ground, polished and the like when, for example, this vacuum chuck is used for a grinding/polishing process.

In addition, in the vacuum chuck according to the embodiment of the second present invention, a nonoxide-based ceramic powder is mixed into the annular partition layer made of glass, and therefore, it is difficult for the glass paste that is applied at the time of manufacture to contract. Therefore, there is no variation in the thickness of the annular partition layer, and portions which can not block permeation of air are not created, and thus, the object to be sucked can be sucked without fail.

Furthermore, a nonoxide-based ceramic powder is mixed into the above-described annular partition layer, which therefore are excellent in the thermal conductivity, and in the vacuum chuck according to the embodiment of the second present invention, heat that is emitted at the time of polishing can be quickly released.

In addition, in the vacuum chuck according to the embodiment of the second present invention, in the case where two or more of annular partition layers for blocking permeation of air are formed in the above-described sucking layer and the outer edge of the above-described annular partition layer is configured to be located in a region of about 0.5 to about 15 mm inside the outer edge of the above-described object to be sucked, object to be sucked of a variety of sizes can be sucked without fail, and object to be sucked of a variety of sizes can be uniformly polished, ground and the like.

In addition, in the vacuum chuck according to the embodiment of the second present invention, in the case where the thickness of the above-described annular partition layer is about 0.1 to about 1.0 mm, air can be blocked without fail and there is no risk that the form of the annular partition layer exposed from the holding surface may be transferred onto the object to be sucked.

In addition, in the vacuum chuck according to the embodiment of the second present invention, in the case where the Young's modulus and the coefficient of thermal expansion of the above-described annular partition layer are almost the same as the Young's modulus and the coefficient of thermal expansion of the porous ceramic, ease of grinding of the annular partition layer and the porous ceramic is almost the same, and it becomes difficult for peeling and the change of form to be caused due to heat that is emitted at the time of processing of a wafer, and thus, the degree of flatness of the holding surface becomes particularly excellent.

Next, a vacuum chuck according to the embodiment of the third present invention is described.

The vacuum chuck according to the embodiment of the third present invention is comprised of a sucking plate for sucking and holding an object to be sucked, and a holder for holding the sucking plate, wherein the sucking plate is comprised of a suction portion through which air permeates and an annular partition layer for blocking permeation of air, and the entirety of the suction portion from a surface where the sucking plate makes contact with the holder to a surface where the sucking plate makes contact with the object to be sucked is formed by a porous ceramic.

Here, in the following description, the surface where the sucking plate makes contact with the holder is referred to as air sucking surface.

In the following, the vacuum chuck according to the embodiment of third the present invention is described in reference to FIG. 8.

Figure 8A:
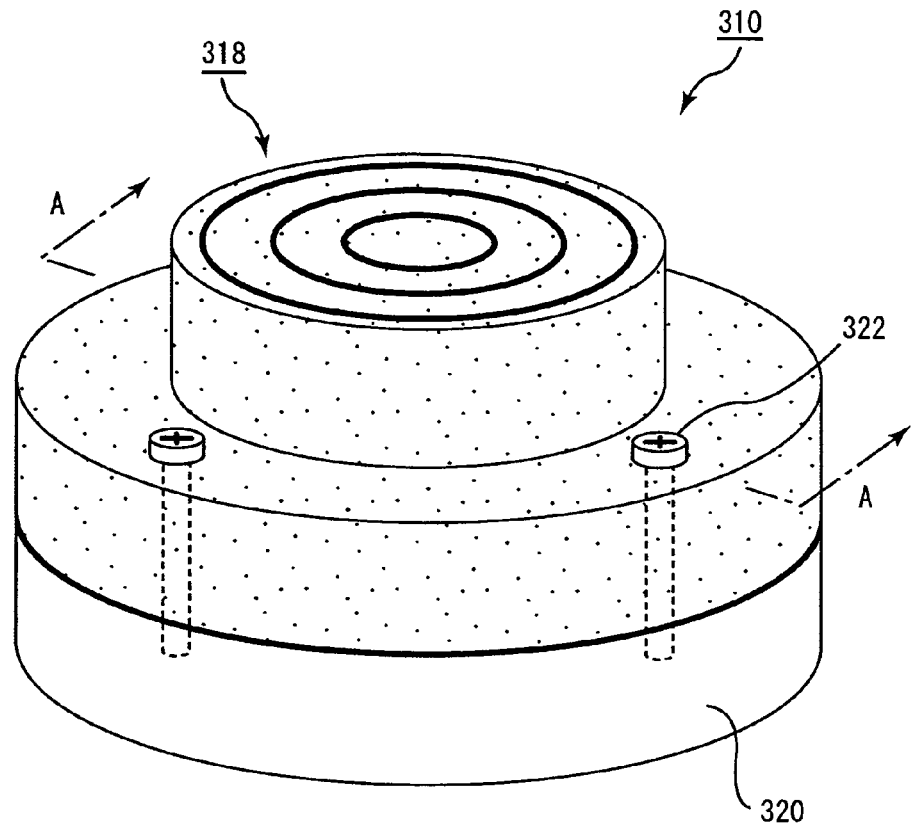
FIG. 8A is a perspective view schematically showing an example of a vacuum chuck according to the embodiment of the third present invention.
Figure 8B:
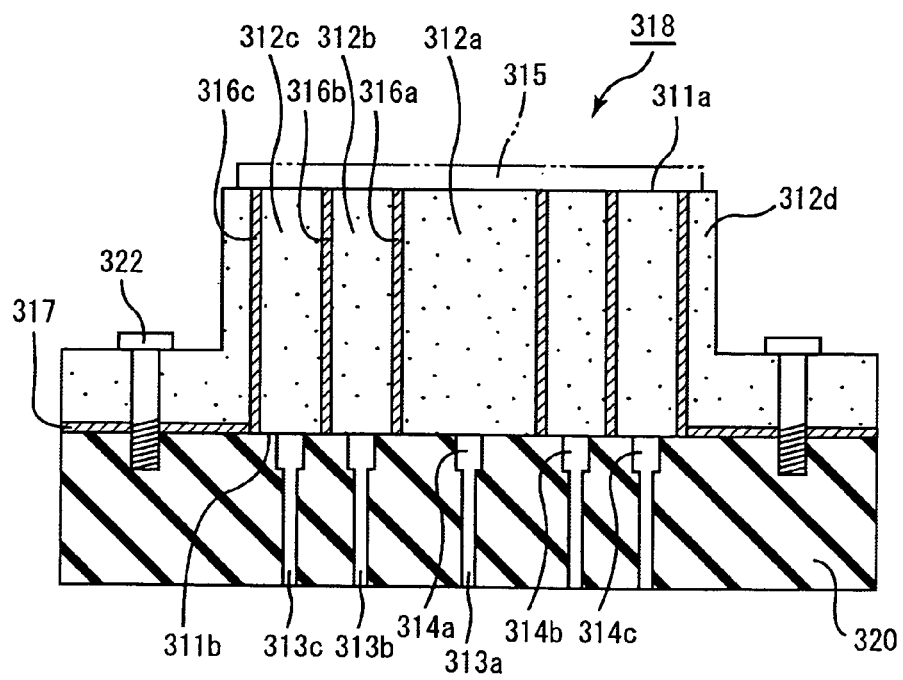
FIG. 8B is an A-A line cross-sectional view of FIG. 8A.

FIG. 8A is a perspective view schematically showing an example of a vacuum chuck according to the embodiment of the third present invention, and FIG. 8B is an A-A line cross-sectional view of FIG. 8A.

In the vacuum chuck according to the embodiment of the third present invention, as shown in FIG. 8, a vacuum chuck 310 is comprised of a sucking plate 311 composed of suction portions 312*a* to 312*d* through which air permeates and annular partition layers 316*a* to 316*c* for blocking permeation of air. The sucking plate 311 has a holding surface 311*a* for sucking and holding a semiconductor wafer (object to be sucked) 315 and an air sucking surface 311*b* for sucking air from the surface opposite to the holding surface 311*a*. In addition, the sucking plate 311 has a form where two discs of different diameters are layered on top of each other and integrated (form of a disc with a brim)

Here, a holding surface 311*a* and an air sucking surface 311*b* are formed on each of the suction portions 312*a* to 312*d*, and the entire portion from this holding surface 311*a* to the air sucking surface 311*b* is continuously formed by a porous ceramic.

In addition, the annular partition layers 316*a* to 316*c* are in annular form and concentric with the sucking plate 311. Here, though the suction portion 312*d* in the form of a doughnut with a brim that forms the sucking plate 311 does not have a function of sucking an object to be sucked, and therefore, essentially does not correspond to a suction portion, the suction portion 312*d* is made of a porous ceramic, as other suction portions 312*a* to 312*c* having a function of sucking an object to be sucked, and therefore, is referred to as suction portion 312*d*, for the sake of convenience.

In addition, a holder 320 where the air sucking portion is connected to a vacuum apparatus, not shown, such as a vacuum pump, is secured to the lower portion of the sucking plate 311 using four bolts 318 which are set in at equal intervals. Here, the number of bolts is not limited to four, and the number is generally approximately 4 to 12.

In addition, the holder 320 is provided with air sucking portions 313*a* to 313*c* where grooves 314*a* to 314*c* are created in the portions which make contact with the air sucking surface 311*b* of the sucking plate 311.

In addition, an air impermeable layer 317 is formed in the portion on the lower surface of the sucking plate and outside the outermost annular partition layer 316*c*.

Here, the air impermeable layer 317 is not necessarily formed, but may be formed if necessary.

Accordingly, the vacuum chuck 310 is formed so as to suck out air from the inside of the suction portions 312*a* to 312*c* through the air sucking portion 313*a* to 313*c* using a vacuum pump (not shown).

In addition, in the vacuum chuck 310 shown in FIG. 8, a porous ceramic is exposed from the side of the sucking plate 311, that is to say, the side of the suction portion 312*d* in the form of a doughnut with a brim, and an air impermeable layer may be formed on this portion. As a result, the polishing liquid or the grinding liquid can be prevented from penetrating.

In the vacuum chuck 310 according to this embodiment, air can be sucked out from the inside of the suction portions 312*a* to 312*c* made of a porous ceramic through the air sucking portions 313*a* to 313*c* using a vacuum pump (not shown), and thereby, the object to be sucked can be sucked and held.

Furthermore, object to be sucked, such as semiconductor wafers of different sizes in the portion to be sucked, can be sucked by selecting appropriate suction portions from inside of which air is sucked out. Specifically, when an object to be sucked of which the size of a portion to be sucked is slightly greater than the size of the outermost annular partition layer 316*c* in a plan view is sucked, the vacuum pump is operated so as to suck out the air from all of the air sucking portions 313*a* to 313*c*, and thereby, the object to be sucked is sucked. When an object to be sucked of which the size of a portion to be sucked is slightly greater than the size of the annular partition layer 316*b* in a plan view is sucked, the object to be sucked is sucked when air is sucked out from the air sucking portions 313*a* and 313*b*. When an object to be sucked of which the size of a portion to be sucked is slightly greater than the size of the annular partition layer 316*a* in a plan view is sucked, the object to be sucked is sucked when air is sucked out only from the air sucking portion 313*a*.

In the vacuum chuck according to the embodiment of the third present invention, the number of annular partition layers which are formed in the sucking plate is not limited to three as shown in FIG. 8, and in the case where two types of semiconductor wafers having portions to be sucked of a different size are sucked as the object to be sucked, at least two annular partition layers may be formed, and in the case where three types of semiconductor wafers having portions to be sucked of a different size are sucked as the object to be sucked, at least three annular partition layers may be formed. In addition, in the case where the size of the object to be sucked is the same, it is necessary to form one annular partition layer.

In the case where the sucking plate of the vacuum chuck according to the embodiment of the third present invention is comprised of at least two suction portions and at least two annular partition layers, the vacuum chuck functions so that it is possible to suck and hold object to be sucked of different sizes without fail.

In addition, in the vacuum chuck 310 according to the embodiment of the third present invention, it is desirable for the degree of flatness of the holding surface 311*a* of the sucking plate 311 to be about 5 μm or less. The reason for this is the same as for the vacuum chuck according to the embodiment of the first present invention.

In addition, in the vacuum chuck 310 according to the embodiment of the third present invention, it is desirable for the difference in height between the portions made of the suction portions on the holding surface 311*a* of the sucking plate 311 and the portions made of the above-described annular partition layers 316*a* to 316*c* to be about 0.5 μm or less. The reason for this is the same as for the vacuum chuck according to the embodiment of the first present invention.

In addition, it is desirable in the vacuum chuck 310 for the Young's modulus and the coefficient of thermal expansion of the annular partition layers 316*a* and 316*b* which form the sucking plate 311 to be almost the same as the Young's modulus and the coefficient of thermal expansion of the suction portions 312*a* to 312*d* (porous ceramic) which compose the sucking plate 311. The reason for this is the same as for the vacuum chuck according to the embodiment of the first present invention.

In the vacuum chuck 310, air can be sucked out through the air sucking portions 313*a* to 313*c* using a vacuum pump (not shown), and thereby, the semiconductor wafer 315 which is placed on the holding surface 311a of the sucking plate 311 can be sucked and held. Here, the vacuum chuck 310 may be provided with a rotation mechanism which allows rotation around the center axis of the sucking plate as the center.

Here, though no grooves or holes are created in the sucking plate 311 shown in FIG. 8, grooves or holes of a variety of forms may be created, for example, in the air sucking surface 311b, in order to increase the suction speed.

In the case where a grinding or polishing process, for example, is carried out using the vacuum chuck 310, the grinding stone is rotated and the vacuum chuck 10 itself is rotated in a state where the object to be sucked, such as a semiconductor wafer, and the axis of the grinding stone are parallel to each other, and then, the two are made to make contact with each other, and thereby, the surface of semiconductor wafer and the like can be ground.

In addition, the polishing table having a polishing surface is rotated, the vacuum chuck 310 itself is rotated, or the two are rotated in a state where the polishing table having a polishing surface and the object to be sucked, such as a semiconductor wafer which are sucked on the holding surface, are parallel to each other, and the two are made to make contact with each other, and thus, the surface of the semiconductor wafer can be polished. A roughened surface may be formed by pasting a polishing cloth on the polishing table, or a roughened surface may be formed using abrasive grains of diamond.

Next, the respective components which form the vacuum chuck according to the embodiment of the third present invention are described.

The form of the above-described sucking plate is not particularly limited, and the same form as that of the sucking plate that forms the vacuum chuck according to the embodiment of first the present invention are exemplified.

The above-described porous ceramic is not particularly limited, and the same porous ceramic as that which forms the sucking plate of the vacuum chuck according to the embodiment of the first present invention an be cited.

In the vacuum chuck according to the embodiment of the third present invention, the form of the holding surface is not particularly limited, but it is desirable to be circular. The reason for this is the same as for the vacuum chuck according to the embodiment of the second present invention. In addition, in the case where the holding surface of the sucking plate is in circular form, as with the embodiment of the second present invention, an appropriate diameter is determined by taking the diameter of the semiconductor wafer which is the object to be polished into consideration, and it is desirable to be about 100 to about 400 mm.

It is desirable for the thermal conductivity of the porous ceramic which forms the above-described sucking plate to be about 50 W/m·K or more. The reason for this is the same as for the vacuum chuck according to the embodiment of the first present invention.

In addition, an appropriate thickness for the sucking plate is determined by taking the thermal conductivity and the Young's modulus of the materials that form the vacuum chuck into consideration, and in the case where the above-described sucking plate is formed by silicon carbide, for example, it is desirable for the thickness to be about 5 to about 60 mm. The reason for this is the same as for the vacuum chuck according to the embodiment of the second present invention.

Though the porosity of the sucking plate is not particularly limited, it is desirable for it to be approximately about 20 to about 50%. The reason for this is the same as for the vacuum chuck according to the embodiment of the first present invention.

It is desirable for the pore diameter of the sucking plate to be uniform, in order to keep the suction force of the holding surface uniform, and the desirable average pore diameter and distribution thereof are the same as in the vacuum chuck according to the embodiment of the second present invention.

It is desirable for the average particle diameter of the sucking plate made of the above-described porous silicon carbide to be about 30 to about 70 μm. The reason for this is the same as for the vacuum chuck according to the embodiment of the first present invention.

Annular partition layers are formed in the above-described sucking plate.

It is desirable for the thickness of the above-described annular partition layers to be about 0.1 to about 1.0 mm. The reason for this is the same as for the vacuum chuck according to the embodiment of the first present invention.

It is desirable for the material of the above-described annular partition layers to be glass, a metal, a ceramic and the like. As a specific example of the material, the same as that in the embodiment of the first present invention are exemplified.

In particular, it is desirable for Young's modulus and the coefficient of thermal expansion of the material of the above-described annular partition layers to be almost the same as the Young's modulus and the coefficient of thermal expansion of the porous ceramic that forms the sucking plate. This is because the ease of grinding of the porous ceramic and the annular partition layers becomes almost the same.

In addition, it is desirable for the outer edge of the above-described annular partition layers to be located in a region of about 0.5 to about 15 mm inside the outer edge of the object to be sucked in the configuration. The reason for this is the same as for the vacuum chuck according to the embodiment of the first present invention.

Accordingly, as shown in FIG. 8, in the case where the annular partition layers are in annular form and the object to be sucked, such as a silicon wafer, is in disc form, it is desirable for the diameter (outer diameter) of the annular partition layer to be smaller than the diameter of the object to be sucked by about 0.5 to about 15 mm in a plan view.

In addition, as shown in FIG. 8, an air impermeable layer may be formed in the above-described sucking plate if necessary. The material for the above-described air impermeable layer is not particularly limited, and the same material as those for the above-described annular partition layers are exemplified.

In addition, the vacuum chuck according to the embodiment of the third present invention is provided with a holder for holding the above-described sucking plate, and a vacuum apparatus and the like is generally connected to this holder. As the above-described holder and the above-described vacuum apparatus, the same as those in the embodiment of the first present invention are exemplified.

A method for manufacturing a vacuum chuck having this configuration will be described in the following.

In addition, in the vacuum chuck according to the embodiment of the third present invention, the form of attaching it to a holder is not limited to the form shown in FIG. 8, and may be a form as that shown in FIG. 9, for example.

Figure 9A:
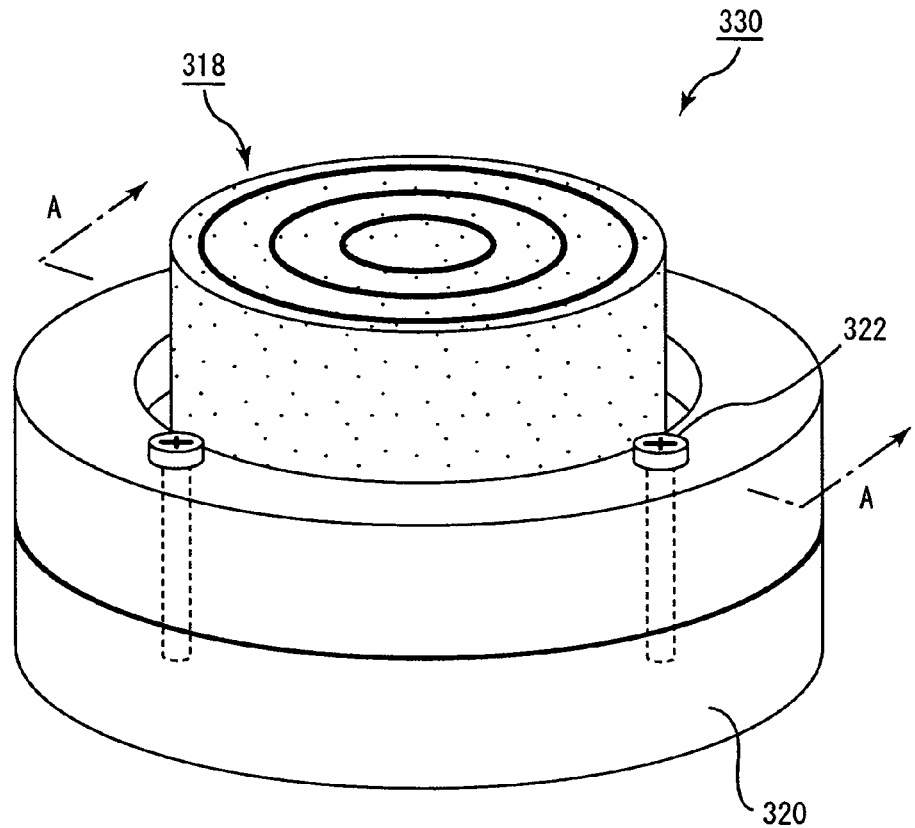
FIG. 9A is a perspective view schematically showing another example of a vacuum chuck according to the embodiment of the second present invention.
Figure 9B:
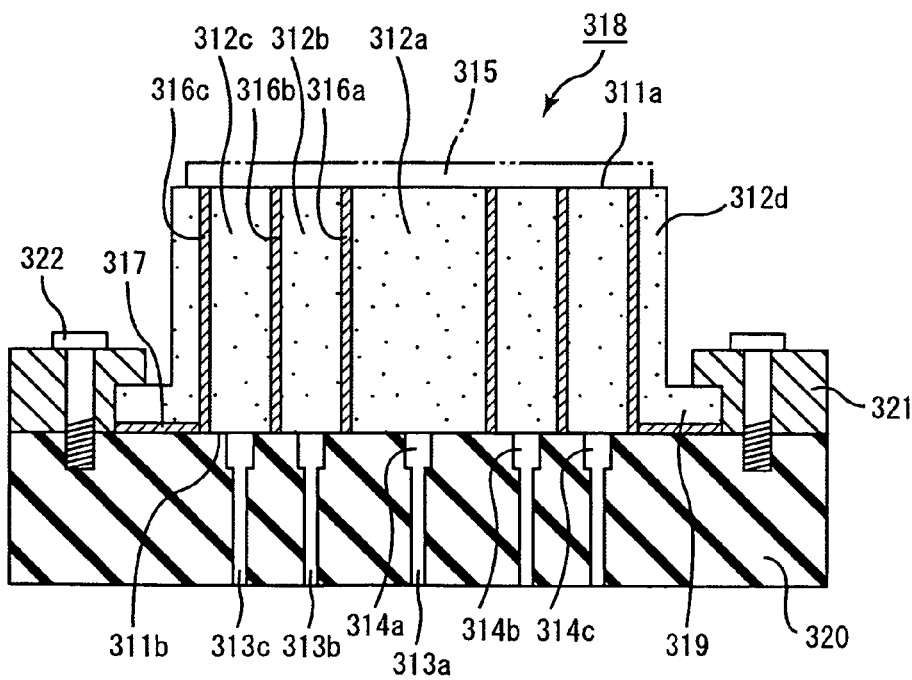
FIG. 9B is an A-A line cross-sectional view of FIG. 9A.

FIG. 9A is a perspective view schematically showing another example of a vacuum chuck according to the embodiment of the third present invention and FIG. 9B is an A-A line cross-sectional view of FIG. 9A.

As shown in FIG. 9, in the vacuum chuck 330 according to the embodiment of the third present invention, the brim portion of the sucking plate 311 is sandwiched between a jig for fixture 321 and a holder 320, and the jig for fixture 321 is secured to the holder 320 with four bolts 323, and thereby, the sucking plate 311 is attached to the holder.

Here, the vacuum chuck 330 is the same as the vacuum chuck 310, except that the method for securing the sucking plate 311 to the holder 320 is different from that for the vacuum chuck 310 shown in FIG. 8, and therefore, the description thereof is omitted.

Next, a method for manufacturing a vacuum chuck according to the embodiment of the third present invention is briefly described.

First, a suction portion in disc form and suction portions in doughnut form made of a porous ceramic are manufactured. In order to manufacture the suction portions, a binder and a dispersion medium area added to a ceramic powder, and a mixed composite is prepared.

The above-described mixed composite is the same as the mixed composite for the formation of the sucking layer described in the embodiment of the first present invention.

After that, a powder in granular form made of this mixed composite is manufactured, and furthermore, manufacturing of a raw molded body, degreasing, sintering and processing are carried out in accordance with the same method as in the embodiment of the first present invention, and thereby, members for the suction material in disc form and doughnut form are manufactured.

Here, in the design, it is desirable for the difference in size between the diameter of the suction portion in disc form and the inner diameter of the suction portion in doughnut form which make contact by interposing an annular partition layer, the outer diameter and the inner diameter of each of suction portion in doughnut form which make contact by interposing an annular partition layer, and the outer diameter of a suction portion in doughnut form and the inner diameter of the suction portion in the form of a doughnut with a brim which make contact by interposing an annular partition layer to be about 0.2 to about 2.0 mm, as in the embodiment of the first present invention.

Next, the suction portions are assembled and the annular partition layers are formed in accordance with the same method as that in the embodiment of the first present invention, and an air impermeable layer is formed if necessary, and thereby, a sucking plate is manufactured, and then, the manufactured sucking plate is secured to a holder which is connected to a vacuum apparatus, such as a vacuum pump, with bolts and the like, and thereby, a vacuum chuck can be manufactured.

The method for manufacturing a sucking plate made of a porous ceramic is not limited to the above-described method, and a variety of conventional methods used for the manufacture of ceramics can be used.

In the vacuum chuck according to the embodiment of the third present invention, the entirety of the suction portion through which air permeates from the surface where the above-described sucking plate makes contact with the above-described holder to the surface where the above-described sucking plate makes contact with the above-described object to be sucked is formed by a porous ceramic.

Therefore, in the case where the entire portion from the holding surface of the sucking plate to the air sucking surface is made of a porous ceramic and a dense ceramic, in the vacuum chuck according to the embodiment of the third present invention, there are no disadvantages in terms of inconsistency in the junction and shifting in the joined portion between the two, and this vacuum chuck has high grinding/polishing precision when used for a grinding/polishing process.

In addition, in the case where, for example, the degree of flatness of the surface where the above-described sucking plate makes contact with the above-described object to be sucked is about 5 μm or less, in the vacuum chuck according to the embodiment of the third present invention, the object to be sucked can be sucked and held without fail, and for example, the object to be sucked can be ground/polished with high precision.

In addition, in the case where the difference in height between a portion made of the suction portion and a portion made of the above-described annular partition layer on the surface where the above-described sucking plate makes contact with the object to be sucked is about 0.5 μm or less in the above-described vacuum chuck, the object to be sucked can be sucked and held without fail, and the object to be sucked can be ground/polished with high precision.

In addition, in the case where the Young's modulus and the coefficient of thermal expansion of the above-described annular partition layer that form the sucking plate are almost the same as the Young's modulus and the coefficient of thermal expansion of the porous ceramic in the vacuum chuck according to the embodiment of the third present invention, ease of polishing of the annular partition layer and the porous ceramic is almost the same, and therefore, it is appropriate to adjust the degree of flatness of the holding surface to within the above-described range.

In addition, in the case where the material for the above-described porous ceramic is silicon carbide in the vacuum chuck according to the embodiment of the third present invention, heat that is emitted at the time of polishing can be quickly released, and there are no disadvantages in terms of reduction in the precision of polishing due to the thermal expansion of silicon carbide, caused by heat that is emitted at the time of polishing.

In addition, in the case where the thickness of the above-described annular partition layer is about 0.1 to about 1.0 mm in the vacuum chuck according to the embodiment of the third present invention, air can be blocked without fail, and it is appropriate to adjust the degree of flatness and/or the differences in height on the holding surface to the above-described desirable range.

In addition, in the case where, for example, the outer edge of the above-described annular partition layer is configured to be located in a region of about 0.5 to about 15 mm inside the outer edge of the above-described object to be sucked in the vacuum chuck according to the embodiment of the third present invention, the object to be sucked can be sucked without fail, and the object to be sucked can be uniformly polished/ground.

Next, a sucking plate according to the embodiment of the fourth present invention is described.

The sucking plate according to the embodiment of the fourth present invention is comprised of a suction portion, which is integrated with a holder for holding a sucking plate for use and through which air permeates, and an annular partition layer for blocking permeation of air, wherein the entirety of the suction portion from a surface where the sucking plate makes contact with the holder to a surface where the sucking plate makes contact with the object to be sucked is formed by a porous ceramic.

The specific embodiments of the sucking plate according to the embodiment of the fourth present invention are the same as the embodiments of the sucking plate that forms the vacuum chuck according to the embodiment of the fourth present invention already described.

In addition, the sucking plate according to the embodiment of the fourth present invention can be manufactured in accordance with the same method as that for manufacturing the sucking plate in the method for manufacturing the vacuum chuck according to the embodiment of the fourth present invention.

In the sucking plate according to the embodiment of the fourth present invention, the entirety of the suction portion through which air permeates from the surface where the above-described sucking plate makes contact with the above-described holder to the surface where the above-described sucking plate makes contact with the above-described object to be sucked is formed by a porous ceramic.

Therefore, in the case where the sucking plate according to the embodiment of the fourth present invention is integrated with a holder for use, when the entire portion from the holding surface of the sucking plate to the air sucking surface is formed by a porous ceramic and a dense ceramic, there are no disadvantages in terms of inconsistency in the junction and shifting in the joined portion between the two, and in the case where this vacuum chuck is used for, for example, a grinding/polishing process, the grinding/polishing precision becomes excellent.

In addition, in the case where the degree of flatness of the surface where the above-described sucking plate makes contact with the above-described object to be sucked is about 5 μm or less in the sucking plate according to the embodiment of the fourth present invention, the object to be sucked can be sucked and held without fail when the above-described sucking plate is integrated with a holder for use, and the object to be sucked can be ground/polished with high precision.

In addition, in the case where the difference in height between the portions made of the suction portion and the portions made of the annular partition layer on the surface where the above-described sucking plate makes contact with the above-described object to be sucked are about 0.5 μm or less in the above-described sucking plate, the object to be sucked can be sucked and held without fail when the above-described sucking plate is integrated with a holder for use, and the object to be sucked can be ground/polished with high precision.

In addition, in the case where the Young's modulus and the coefficient of thermal expansion of the above-described annular partition layer that form the sucking plate are almost the same as the Young's modulus and the coefficient of thermal expansion of the porous ceramic in this sucking plate according to the embodiment of the fourth present invention, ease of polishing of the annular partition layer and the porous ceramic is almost the same, and therefore, it is appropriate to adjust the degree of flatness of the holding surface to the above-described range.

In addition, in the case where the material for the above-described porous ceramic is silicon carbide in the sucking plate according to the embodiment of the fourth present invention, when the above-described sucking plate is integrated with a holder for use, heat that is emitted at the time of polishing can be quickly released, and there are no disadvantages in terms of reduction in the precision of polishing due to the thermal expansion of silicon carbide, caused by heat that is emitted at the time of polishing.

In addition, in the case where the thickness of the above-described annular partition layer is about 0.1 to about 1.0 mm in the sucking plate according to the embodiment of the fourth present invention, air can be blocked without fail, and it is appropriate to adjust the degree of flatness and/or the differences in height on the holding surface to the above-described desirable range.

In addition, in the case where, for example, the outer edge of the above-described annular partition layer is configured to be located in a region of about 0.5 to about 15 mm inside the outer edge of the above-described object to be sucked in the sucking plate according to the embodiment of the fourth present invention, when the sucking plate is integrated with a holder for use, the object to be sucked can be sucked without fail, and the object to be sucked can be uniformly polished/ground.

Next, a vacuum chuck according to the embodiment of the fifth present invention is described.

The vacuum chuck according to the embodiment of the fifth present invention is a vacuum chuck configured so as to include a sucking body made of a porous ceramic, having a holding surface for sucking and holding an object to be sucked; and a sealing body for sealing approximately the entirety of a surface of the sucking body, excluding the holding surface and an air sucking hole corresponding portion, wherein when the pore distribution in the sucking body is measured in accordance with a mercury injection method, the average pore diameter is 10 to 40 μm, the ratio of pores having a pore diameter of 0.7 to 1.2 times of the average pore diameter to the total volume of pores is about 75% or more, the ratio of pores having a pore diameter of less than 0.7 times of the average pore diameter to the total volume of pores is about 15% or less, and the ratio of pores having a pore diameter of more than 1.2 times of said average pore diameter to the total volume of pores is about 10% or less.

The vacuum chuck according to the embodiment of the fifth present invention is configured so as to include a sucking body made of a porous ceramic and a sealing body.

The material of the above-described sucking body is not particularly limited, the same porous ceramics as those that form the sucking plates of the vacuum chuck according to the embodiment of the fifth present invention are exemplified.

When the pore distribution in the above-described sucking body of the vacuum chuck according to the embodiment of the fifth present invention is measured in accordance with a mercury injection method, the lower limit of the average pore diameter is about 10 μm and the upper limit is about 40 μm. It is desirable for the lower limit of the above-described average pore diameter to be about 20 μm and it is desirable for the upper limit to be about 35 μm, and it is more desirable for the lower limit to be about 25 μm and for the upper limit to be about 30 μm.

In the case where the average pore diameter of the above-described sucking body is about 10 μm or more, it becomes easy to carry out a vacuuming using the vacuum chuck according to the embodiment of the fifth present invention, and therefore, it becomes unnecessary to reduce the thickness of the above-described sucking body, and thus, mechanical strength can sufficiently be secured. Meanwhile, in the case where the average pore diameter is about 40 μm or less, the difference in the suction force between portions where pores exist on the surface and portions where no pores exist becomes small, and as a result, a polished surface in such a form that pores are not transferred onto the object to be sucked is formed, and a uniform polished surface can be formed, and thus the degree of flatness of the polished surface of the object to be sucked does not deteriorate.

Here, the average pore diameter of the above-described sucking body can be measured in accordance with a conventional, well known method, such as measurement using, for example, a scanning electron microscope (SEM), in addition to a mercury injection method as described above.

In addition, in the vacuum chuck according to the embodiment of the fifth present invention, the ratio of pores having a pore diameter of 0.7 to 1.2 times of the above-described average pore diameter (hereinafter referred to as main pores) to the total volume of the pores in the above-described sucking body is about 75% or more. That is to say, pores of which the average pore diameter is 10 to 40 μm occupy the major part of pores in the above-described sucking body, and the peak in the distribution of the pore diameter is very sharp, and thus, variation in the pore diameter is small.

In the case where the ratio of the above-described main pores to the total volume of the pores is about 75% or more, variation in the pore diameter of the above-described sucking body is small, and there occurs no variation in the force for sucking the object to be sucked, and thus, when the object to be sucked is attempted to be polished using the vacuum chuck according to the embodiment of the fifth present invention, for example, there occurs no difference in the suction force between different portions, and therefore, polishing of the object to be sucked become uniform.

It is desirable for the ratio of the above-described main pores to the total volume of the pores to be about 80% or more, and it is more desirable for it to be about 85% or more.

In addition, the ratio of pores having a pore diameter of less than 0.7 times of the above-described average pore diameter (hereinafter referred to as micro pores) to the total volume of the pores in the above-described sucking body is about 15% or less, and the ratio of pores having a pore diameter of more than 1.2 times of the above-described average pore diameter (hereinafter referred to as large pores) to the total volume of the pores in the above-described sucking body is about 10% or less. That is to say, pores which are smaller than the above-described main pores (micro pores) and pores which are greater than the above-described main pores (large pores) exist almost uniformly in the above-described sucking body.

When the ratio of the above-described micro pores to the total volume of the pores exceeds about 15%, the ratio of the above-described main pores to the total volume of the pores becomes, for example, about 75% or more, and in the case where the average pore diameter at this time is as small as approximately 10 μm, the ratio of the micro pores which exist in the sucking body becomes high, hereby making the carrying out of a vacuuming using the vacuum chuck according to the embodiment of the fifth present invention difficult, and therefore, it becomes necessary to reduce the thickness of the above-described sucking body, and mechanical strength can not sufficiently be secured. Meanwhile, in the case where the ratio of the above-described large pores to the total volume of the pores exceeds about 10%, the ratio of the above-described main pores to the total volume of the pores becomes, for example, about 75% or more, and in the case where the average pore diameter at this time is as great as approximately 40 μm, the ratio of the large pores that exist in the sucking body become high, hereby causing a difference in the suction force between portions when the object to be sucked is polished using the vacuum chuck according to the embodiment of the fifth present invention, and therefore, polishing of the object to be sucked does not become uniform.

It is desirable for the ratio of the above-described micro pores and large pores to the total volume of the pores to be about 10% or less and about 5% or less, respectively.

In the vacuum chuck according to the embodiment of the fifth present invention, it is desirable for the lower limit of the porosity in the above-described sucking body to be about 20% and for the upper limit to be about 50%. The reason for this is the same as why it is desirable for the porosity in the sucking plate that forms the vacuum chuck according to the embodiment of the first present invention to be in the above-described range.

It is more desirable for the lower limit of the above-described porosity to be about 25% and for the upper limit to be about 45%, and it is most desirable for the lower limit to be about 30% and the upper limit to be about 40%.

In addition, it is desirable for the lower limit of the average particle diameter of the above-described sucking body to be about 30 μm and for the upper limit to be about 70 μm. The reason for this is the same as why it is desirable for the average particle diameter in the sucking plate that forms the vacuum chuck according to the embodiment of the first present invention to be in the above-described range.

The form of the above-described sucking body is not particularly limited, and the same form as that for the sucking plate that forms the vacuum chuck according to the embodiment of the first present invention are exemplified.

In addition, though the mechanical strength of the above-described sucking body is not particularly limited, it is desirable for it to be about 20 MPa or more in a three-point bending test in accordance with, for example, JIS R 1601. In the case where the strength is about 20 MPa or more, warping and crack hardly occur in the above-described sucking body.

The contents of JIS R 1601 are incorporated herein by reference in its entirety.

The desirable thermal conductivity for the above-described sucking body is the same as the thermal conductivity of the sucking plate that forms the vacuum chuck according to the embodiment of the first present invention.

In addition, an appropriate thickness for the above-described sucking body is determined by taking the average pore diameter and the average porosity of the sucking body, as well as the thermal conductivity of the material that forms the sucking body, into consideration, and in the case where the above-described sucking body is formed by silicon carbide, for example, the desirable thickness and the reason why this thickness is desired are the same as for the sucking plate that forms the vacuum chuck according to the embodiment of the third present invention.

In addition, in the vacuum chuck according to the embodiment of the fifth present invention, the above-described sucking body has a holding surface for sucking and holding an object to be sucked, and the form of this holding surface generally varies depending on the form of the object to be sucked, and only the holding surface may be formed so as to have a certain form. In addition, it is desirable for the holding surface to be finished to a flat surface with high precision, and a desirable upper limit for the degree of flatness of the above-described holding surface is about 10 μm, and a more desirable upper limit is about 5 μm.

In the case where the degree of flatness of the above-described holding surface is about 10 μm or less, for example, the degree of flatness of the polished surface does not deteriorate when the object to be sucked is polished.

In the case where the vacuum chuck according to the embodiment of the fifth present invention is used as a polishing apparatus, in particular, a polishing apparatus for polishing the surface of semiconductor wafers, it is desirable for the form of the holding surface to be disc form.

The size of the above-described holding surface is not particularly limited, and the dimensions are determined in accordance with the size of the object to be sucked, and when an object to be sucked, such as a semiconductor wafer, for example, is held, it is desirable for the holding surface to be formed so as to have a form and dimensions where the outer edge of the above-described object to be sucked is located about 0.1 to about 15 mm inside the outer edge of the holding surface of the sucking body. This is because the suction force is high and the suction force of the sucking body is uniform throughout the entirety, therefore, the object to be sucked can be uniformly polished when the vacuum chuck is used for a polishing apparatus.

In the case where the outer edge of the object to be sucked is not configured to be located outside the portion of about 0.1 mm inside the outer edge of the holding surface of the above-described sucking body when the above-described object to be sucked is sucked and held, that is to say, in the case where the distance between the outer edge of the object to be sucked and the outer edge of the sucking body is set to be about 0.1 mm or more, the object to be sucked and the sealing body does not easily make contact with each other, in relation to the level of precision upon placing the semiconductor wafer. Therefore, the semiconductor wafer does not make contact with the sealing body and levitates at time of polishing.

In such cases, when the vacuum chuck according to the embodiment of the fifth present invention is used for a polishing apparatus for a semiconductor wafer, for example, the portion in the neighborhood of the edge of the semiconductor wafer is not excessively polished, and polishing does not become uneven.

Meanwhile, in the case where the outer edge of the above-described object to be sucked is located on about 15 mm or more further inside the outer edge of the holding surface of the sucking body when the above-described object to be sucked is held, there causes a large gap between the object to be sucked and the sealing body and a large amount of air is sucked through this gap, hereby making the suction force in the outer periphery of the object to be sucked weak, and therefore, the object to be sucked levitates, and for this reason, the portion in the neighborhood of the edge of the semiconductor wafer is excessively polished.

In the case where the holding surface of the sucking body is circular, an appropriate diameter is determined by taking the diameter of the like of the semiconductor wafer which is the object to be polished into consideration, and it is desirable for the diameter to be about 100 to about 330 mm.

The above-described sealing body is provided so as to seal almost the entirety of the surface of the above-described sucking body, excluding the holding surface, and prevents air from leaking from portions other than the holding surface of the above-described sucking body. In addition, air sucking portions are provided in a part of the sealing body, so that air can be sucked from inside the sealing body (inside the sucking body) via these air sucking portions, and thereby, the inside of the sucking body becomes of a state of reduced pressure, and thus, it becomes possible to suck an object to be sucked.

The material for the above-described sealing body and securing base is not particularly limited, and may be a metal, such as SUS, steel or an aluminum alloy, or a ceramic, such as silicon nitride, silicon carbide or alumina, and it is desirable for the material to be a dense body having a mechanical strength of a certain level or higher. This is because it is necessary for the material to have such mechanical properties that it can bear reduced pressure (vacuum), and it is necessary to prevent air from leaking from the sealing body.

Figure 10A:
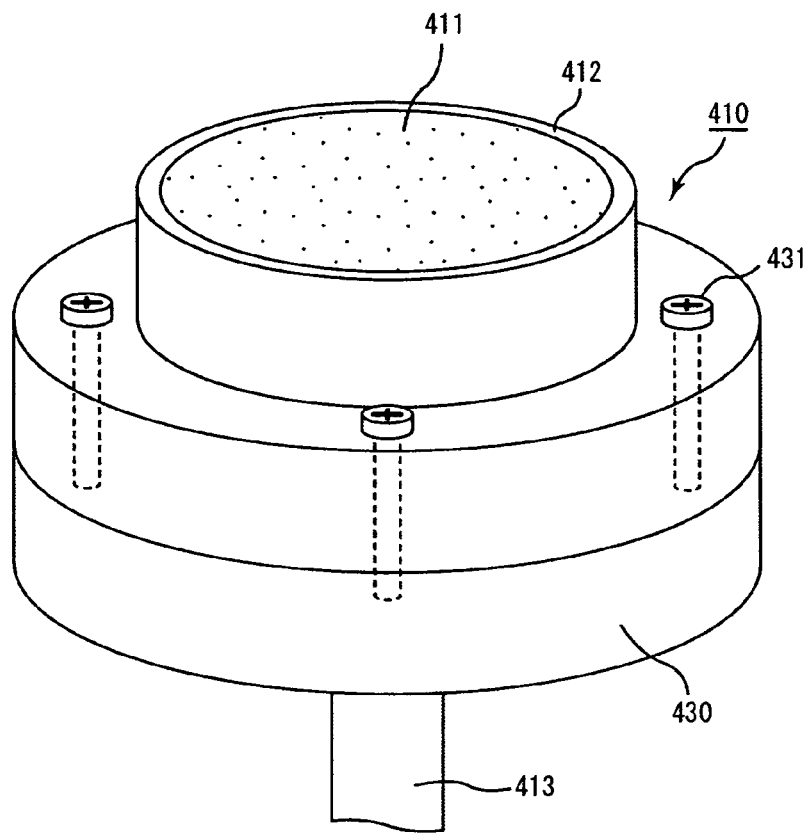
FIG. 10A is a perspective view schematically showing an example of a vacuum chuck according to the embodiment of the fifth present invention.
Figure 10B:
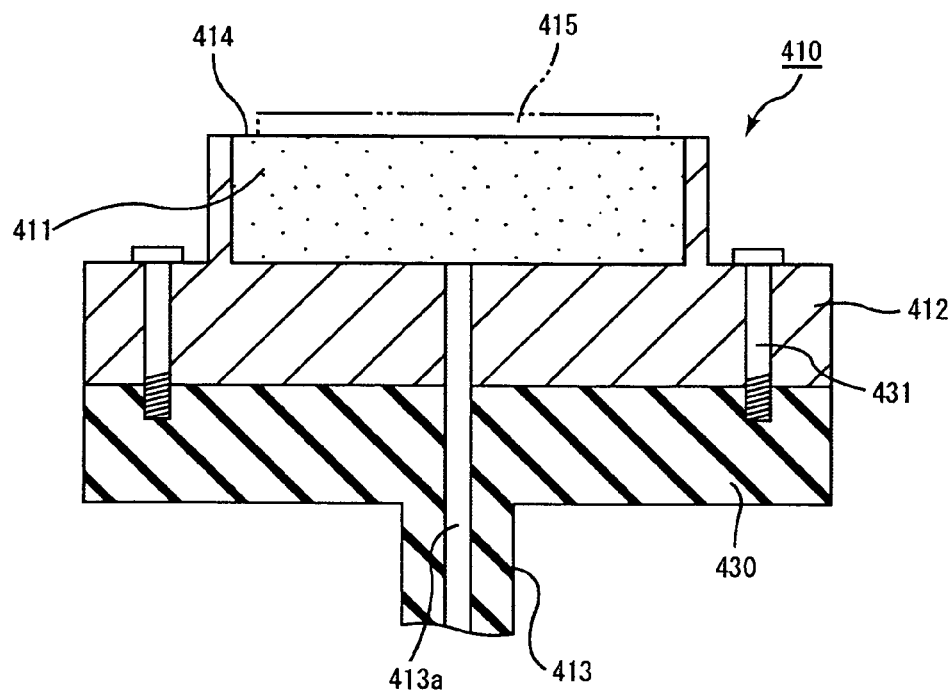
FIG. 10B is a cross sectional view of FIG. 10A.

FIG. 10A is a perspective view schematically showing an example of a vacuum chuck according to the embodiment of the fifth present invention, and FIG. 10B is a cross sectional view of FIG. 10A.

As shown in FIGS. 10A and 10B, a vacuum chuck 410 is comprised of a sucking body 411 and a sealing body 412, sucking body 411 in disc form is secured inside a cylindrical body of the sealing body 412 having such a form that the cylindrical body is integrally formed on top of a disc, and the securing base 430 is provided on the bottom of the vacuum chuck 410 having the above-described configuration.

In addition, the sealing body 412 is secured to the securing base 430 with four bolts 431 which are set at equal intervals, and an air sucking portion 413 having an air sucking hole 413a which is connected to the lower surface of the sucking body 411 is provided in the center portion of this securing base 430, so that air can be sucked out from inside the sucking body 411 through this air sucking hole 413a. Here, this vacuum chuck 410 may have a rotation mechanism which allows rotation around the center axis of the air sucking portion 413 as the center.

In addition, after the vacuum chuck 410 is assembled, the air sucking portion 413 is connected to a vacuum pump via an appropriate member in tube form, and air is sucked out through this air sucking hole 413a, and thereby, a semiconductor wafer 415 that is placed on the holding surface 414 of the sucking body 411 can be sucked and held.

Here, though no grooves are created in the sucking body 411 shown in FIG. 10, grooves of a variety of forms may be created on the surface on the side opposite to the holding surface 414, for example, in order to increase the suction speed.

In addition, a polishing table is rotated, the vacuum chuck 410 itself is rotated or the two are rotated in a state where the polishing table having a polishing surface and a semiconductor wafer 415 which is sucked on the holding surface are parallel to each other, and then the two are made to make contact with each other, and thereby, the surface of the semiconductor wafer 415 can be polished. Here, as for the above-described abrasive table, the roughened surface may be formed by pasting an abrasive cloth to a table or the roughened surface may be formed using diamond abrasive grains.

The form of the sealing body 412 is not limited to the form shown in FIG. 10, and, for example, a cavity may be created within the entirety of surface on the side opposite to the holding surface 414 of the sucking body 411. In addition, a part of the lower portion of the sealing body 412a that makes contact with the surface on the side opposite to the holding surface 414 is formed so as to be thick, so that grooves or holes for leading air that is sucked into the air sucking hole to the air sucking hole may be created in this part.

The use of the vacuum chuck according to the embodiment of the fifth present invention is not particularly limited, and the vacuum chuck may be used for carrying out a heating process, a grinding process, a polishing process, a CVD process or a PVD process such as sputtering, on an object to be sucked.

As described above, in the vacuum chuck according to the embodiment of the fifth present invention, when the pore distribution in the sucking body is measured in accordance with a mercury injection method, the average pore diameter is 10 to 40 µm, the ratio of pores having a pore diameter of 0.7 to 1.2 times of the above-described average pore diameter to the total volume of the pores is about 75% or more, the ratio of pores having a pore diameter of less than 0.7 times of the above-described average pore diameter to the total volume of the pores is about 15% or less, and the ratio of pores having a pore diameter of more than 1.2 times of the above-described average pore diameter to the total volume of the pores is about 10% or less, the pore diameter of the above-described sucking body is set to an appropriate size, and there is almost no variation in the pore diameter, and therefore, the suction force is high and the suction force is uniform throughout the entirety, and there is almost no unevenness in the distribution of the suction force, and therefore, in the case where the vacuum chuck is used for a polishing apparatus, there occurs no such phenomenon where the pattern of pore distribution is transferred, and the object to be sucked can be uniformly polished.

Next, a method for manufacturing a vacuum chuck according to the embodiment of the fifth present invention is briefly described.

First, a sucking body is manufactured.

A mixed composite which includes at least a ceramic powder, a binder and a dispersion medium is prepared for the manufacture of a sucking body.

It is desirable to make the particle diameter uniform to a certain degree in advance, so that the variation in the average particle diameter of the above-described ceramic powder (coarse powder) is small. This is because when there is great variation in the average particle diameter of the ceramic powder, there occurs sometimes variation in the pore diameter of the sucking body to be manufactured. The method for making the particle diameter of the above-described ceramic powder uniform is not particularly limited, and well known methods, for example a method for molding a ceramic powder into a agglomerate having a high density, and after that, crushing and pulverizing this agglomerate into particles which are then granulated, are exemplified.

It is desirable in the above-described ceramic powder for the ratio of the ceramic powder having a particle diameter of 0.7 to 1.2 times of the average particle diameter to the total amount of the ceramic powder to be about 75% or more, so that the average pore diameter and the distribution of the pores fall within the above-described range in the sucking body described above. Of course, the method for adjusting the average pore diameter and the distribution of the pores in the above-described sucking body to the above-described range is not limited to the method for adjusting the particle diameter of a ceramic powder.

It is desirable in the above-described ceramic powder for about 10 to about 100 parts by weight of a fine powder having an average particle diameter of about 0.1 to about 1.0 to be uniformly mixed with 100 parts by weight of a coarse powder having an average particle diameter of about 5 to about 100 µm.

The above-described binder is not particularly limited, and methyl cellulose, carboxymethyl cellulose, hydroxyethyl cellulose, polyethylene glycol, phenol resins and epoxy resins are exemplified.

It is generally desirable for the amount of the above-described binder mixed in to be about 1 to about 10 parts by weight relative to 100 parts by weight of the ceramic powder.

The above-described dispersion medium is not particularly limited, and organic solvents such as benzene, alcohols such as methanol, and water are exemplified.

An appropriate amount of the above-described dispersion medium is mixed in, so that the viscosity of the mixed composite falls within a certain range. The ceramic powder, the binder and the dispersion medium are mixed in an atritor and the like, and after that, sufficiently kneaded in a kneader, and furthermore, processed in accordance with a spray dry method, and thereby, a powder in granular form is manufactured. In addition, these granulated powder are put into a die and molded, and thereby, a raw molded body is manufactured. This raw molded body is heated to about 400 to about 650° C. under an inert gas (argon) atmosphere, to be degreased, and the binder and the like are decomposed and eliminated, and thereby, almost only the ceramic powder remains.

Then, after the above-described degreasing process is carried out, the ceramic powder is heated to about 1400 to about 2300° C. under an inert gas atmosphere of, for example, nitrogen or argon, so as to be fired, and then, the ceramic powder is sintered and a sucking body is manufactured.

The method for manufacturing a sucking body as described above is not limited to the above-described method, and a method using a raw material made of a ceramic powder of which the particle diameter is made uniform to a certain degree in advance, metal silicon, which is a binder for binding this ceramic powder, a binder and a dispersing medium, for manufacturing a raw molded body as that described above, and after that firing the raw molded body, and thereby, binding the above-described ceramic powder with the above-described metal silicon so that a sucking body is manufactured, as well as a method using a binder of the above-described mixed composite containing starch for manufacturing a sucking body from this starch containing mixed composite, are exemplified.

After that, a vacuum chuck is assembled in accordance with a method as that described in reference to FIG. 10.

Next, a vacuum chuck according to the embodiment of the sixth present invention is described.

The vacuum chuck according to the embodiment of the sixth present invention is configured so as to include a sucking body made of a porous ceramic, having a holding surface for sucking and holding an object to be sucked, on which a sealing layer for sealing approximately the entirety of a surface, excluding the holding surface and an air sucking holes corresponding portion is formed, wherein when the pore distribution in the sucking body is measured in accordance with a mercury injection method, the average pore diameter is 10 to 40 µm, the ratio of pores having a pore diameter of 0.7 to 1.2 times of the average pore diameter to the total volume of pores is about 75% or more, the ratio of pores having a pore diameter of less than 0.7 times of the average pore diameter to the total volume of pores is about 15% or less, and the ratio of pores having a pore diameter of more than 1.2 times of the average pore diameter to the total volume of pores is about 10% or less.

The sucking body (porous ceramic) for the formation of the vacuum chuck according to the embodiment of the sixth present invention uses the same materials and has the same properties as the sucking body for the formation of the vacuum chuck according to the embodiment of the fifth present invention, except that a sealing layer for sealing almost the entirety of the surface excluding the holding surface is formed, and therefore, the above-described different point is described.

Figure 11A:
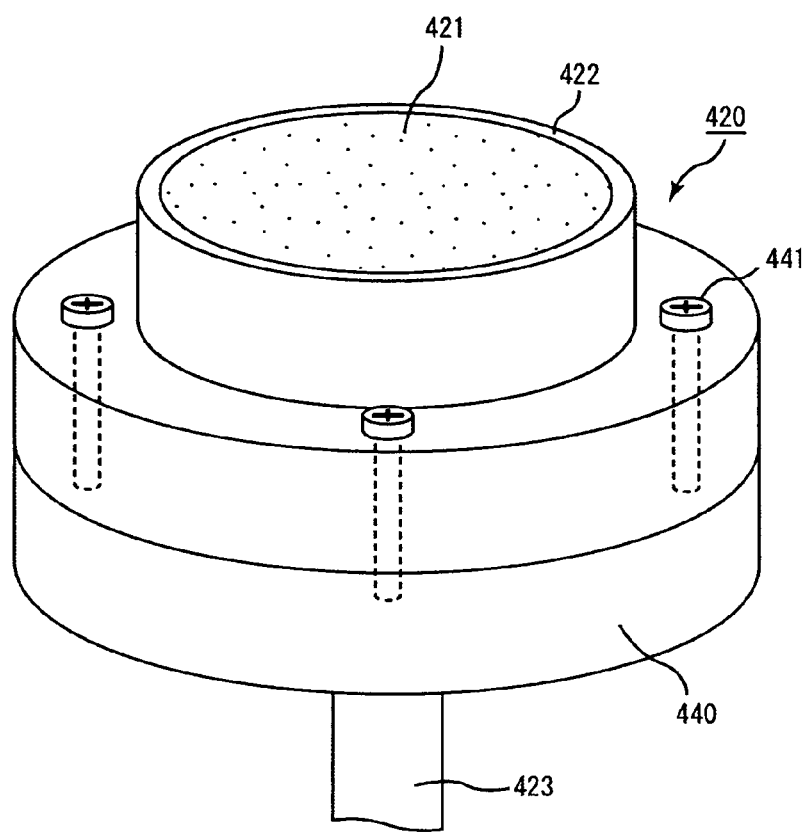
FIG. 11A is a perspective view schematically showing an example of a vacuum chuck according to the embodiment of the sixth present invention.
Figure 11B:
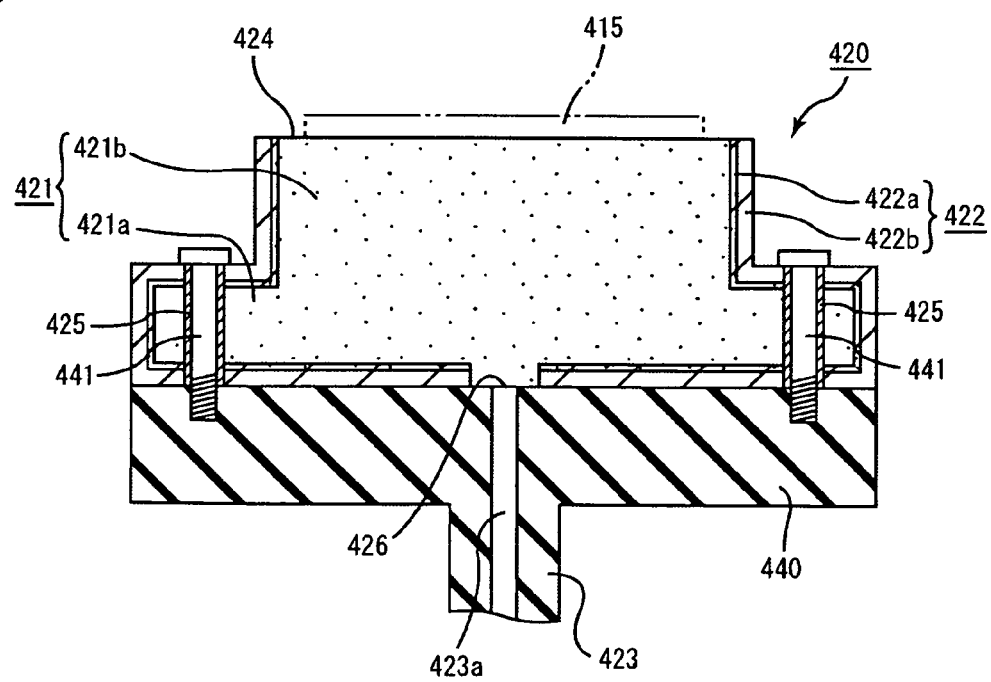
FIG. 11B is a cross sectional view of FIG. 11A.
Figure 12A:
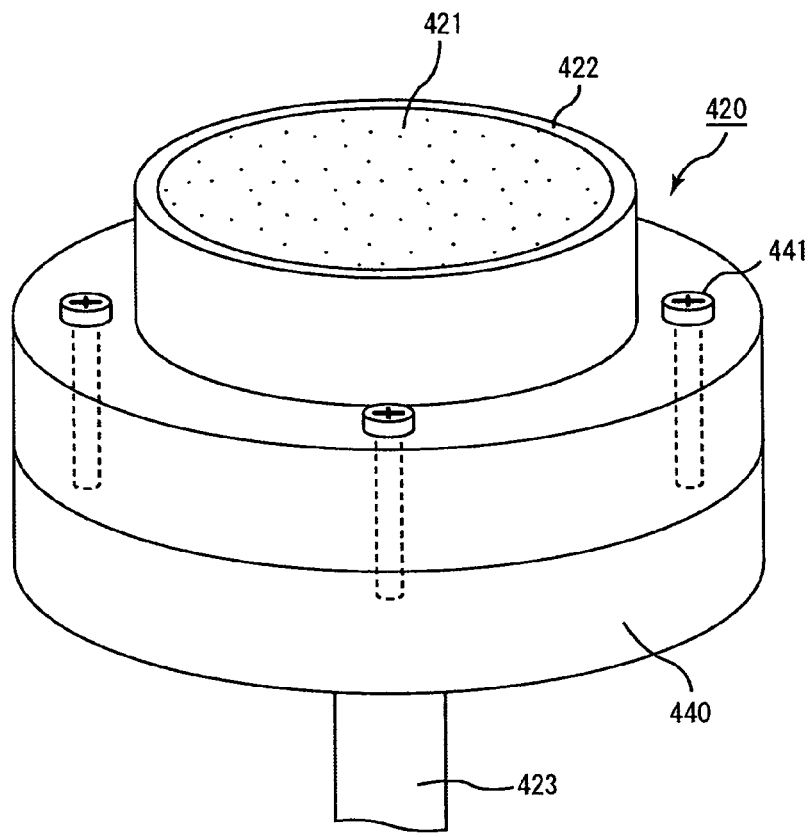
FIG. 12A is a perspective view schematically showing another example of a vacuum chuck according to the embodiment of the sixth present invention.
Figure 12B:
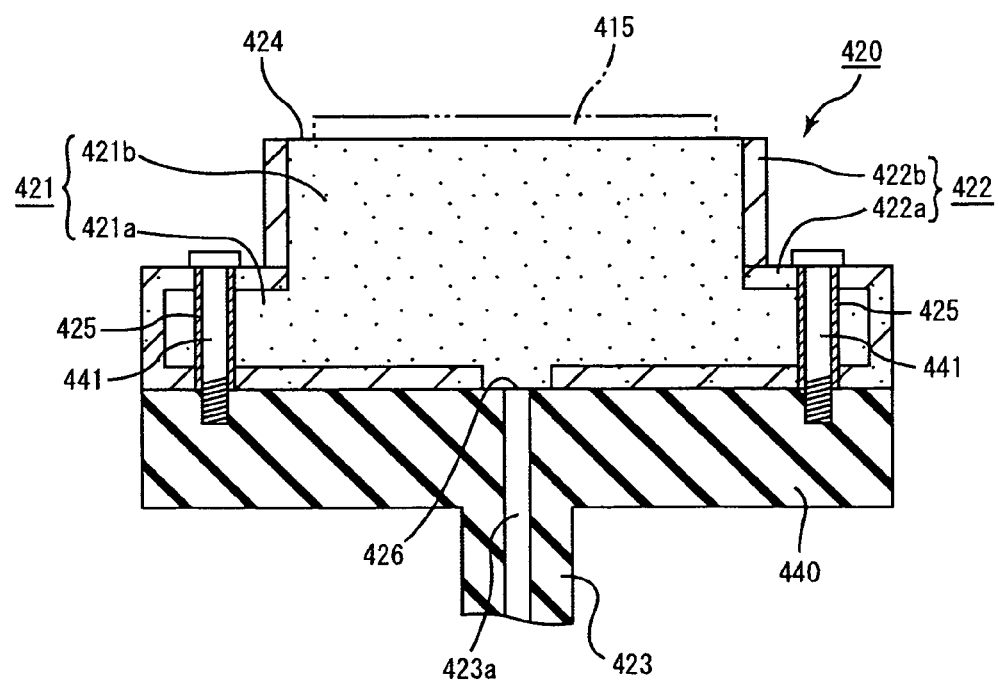
FIG. 12B is a cross sectional view of FIG. 12A.

FIG. 11A is a perspective view schematically showing an example of the vacuum chuck according to the embodiment of the sixth present invention, and FIG. 11B is a cross sectional view of FIG. 11A. FIG. 12A is a perspective view schematically showing another example of the vacuum chuck according to the embodiment of the sixth present invention, and FIG. 12B is a cross sectional view of FIG. 12A.

As shown in FIGS. 11 and 12, a vacuum chuck 420 is comprised of a sucking body 421 where a sealing layer 422 is formed on the entirety of the surface, excluding the holding surface 424 which is formed in the upper portion of the vacuum chuck and a portion corresponding to an air sucking hole 423 (portion corresponding to air sucking hole), and a securing base 440 for supporting and securing the sucking body 421 on which the sealing layer 422 is formed is provided on the bottom of the vacuum chuck. In addition, the sucking body 421 has a form where the upper portion of a sucking body 421*b* in the form of a disc having a smaller diameter is integrally formed on top of a lower portion of a sucking body 421a in disc form, in such a manner that the center axis is shared, and through holes for fixing the vacuum chuck are created in this lower portion of the sucking body 421a at equal intervals.

In addition, bolts 441 are screwed into the through holes of the lower portion of the sucking body 421a, so that the vacuum chuck is secured to the securing base 440, and at the same time, the inside of through holes are filled with a sealing agent 425, and thereby, the portions of the sucking body 422 for the through holes are sealed, while an air sucking portion 423 having an air sucking hole 423a which is connected to the lower surface of the sucking body 421 is provided at the center of the securing base 440.

In addition, air can be sucked out through the air sucking hole 423a, and thereby, this vacuum chuck 420 can suck and hold a semiconductor wafer 415 which has been placed on the holding surface 424 of the sucking body 421, in the same manner as in the case of the vacuum chuck 410.

The sealing layer 422 can be formed by adhering a polymer in liquid form, a raw material for the formation of a polymer or a glass composite through application and the like to the surface, excluding the holding surface 424 and the portion which corresponds to the air sucking hole 426 of the sucking body 421, as shown in FIGS. 11 and 12.

The sealing layer 422 may be an internally solidified layer 422a which is formed by impregnating interior of the sucking body 421 with a raw material and solidifying the raw material, a coating layer 422b which is formed by solidifying a raw material on the surface without impregnating the sucking body 421 with the raw material, or a complex layer made of an internally solidified layer 422a and the coating layer 422b, formed so that the interior of sucking body 421 is partially impregnated with a raw material which is then solidified, as shown in FIG. 11.

In addition, the sealing layer 422 may be made of two or more layers selected from the group consisting of the internally solidified layer 422a, the coating layer 422b and the above-described complex layer, and, for example, the coating layer 422b may be formed on the upper portion of the sucking body 421b, and an internally solidified layer 422a may be formed on the lower portion of the sucking body 421a, as shown in FIG. 12.

The sealing layer 322 is formed in this manner, and thereby, preventing air from being sucked out from any surface other than the holding surface 324, and air can be sucked out from inside of the sucking body 321 through the portions corresponding to the air sucking hole 326 and the air sucking hole 323a.

In addition, in the case where the surface of the sucking body 421 that makes contact with the securing base 440 is not a side face, the sealing layer 422 may be omitted, and, for example, grooves may be created on the surface on the side opposite to the holding surface 424 of the sucking body 421, so that air can be sucked out from this portion in the configuration, or openings other than the portion which corresponds to the air sucking hole 426 is formed in the sealing layer 422 which is formed on the surface on the side opposite to the holding surface 424, so that air can be sucked out through these openings in the configuration.

Here, the form of the sucking body 421 is not limited to a form where discs of different diameters are integrally layered on top of each other as shown in FIGS. 11 and 12, and may be disc form, as shown in FIG. 10, or another form.

This vacuum chuck 420 may be provided with a rotation mechanism which allows rotation around the center axis of the air sucking portion as the center.

The material for the securing base 440 may be the same as that for the securing base 430 described in the embodiment of the fifth present invention. Here, in the case where grooves are created on the surface on the side opposite to the holding surface 424 of the sucking body 421, or in the case where openings are created in the sealing layer 422, of course, grooves or holes for leading air that is sucked to the air sucking hole 423a are created in corresponding portions of the securing base 440.

The material that forms the sealing layer 422 is not particularly limited, and resins, glass, metals and ceramics are exemplified, resins are preferable because the sealing layer can be relatively easily formed.

The above-described resins may be thermosetting resins or thermoplastic resins. The above-described thermosetting resins are not particularly limited, and epoxy resins, polyimide, xylene resins, polyurethane, melamine resins, phenol resins, unsaturated polyester resins and urea resins are exemplified. In the case where one of these thermoplastic resins is used, a resin that is in liquid form before being converted to a polymer, for example, may be applied, and after that, the resin may be heated and cured.

The above-described thermoplastic resins are not particularly limited, and ABS resins, AS resins, polyethylene, polypropylene, polyamide, polyamide imide, polyvinyl chloride, polystyrene, polymethyl methacrylate and polyvinyl acetate are exemplified. These thermoplastic resins may be applied in a dissolved state in a solvent, so as to form a layer which becomes sealing layer 322, after that, curing by evaporating the solvent, or heated so that the viscosity is lowered, and after that, injected to the sucking body, and thereby, the sealing layer 322 may be formed.

A material such as glass, metals or ceramics, is heated to a temperature that is close to the melting point, and melted or their viscosity has been lowered. These processed material are impregnated or injected into the sucking body.

It is preferable in the sealing layer 422 in the neighborhood of the holding surface of the sucking body for the thickness of the internally solidified layer 422a to be small and for the thickness of the coating layer 422b to be great. It is more preferable for the sealing layer 422 in the neighborhood of the holding surface of the sucking body to be a coating layer 422b which is formed on the surface of the above-described sucking body. This is assumed to be because in the case where the thickness of the internally solidified layer 422a is great in the neighborhood of the above-described holding surface, the internally solidified layer expands in the neighborhood of the holding surface due to the heat from polishing or swelling, and it becomes easy for the layer to make contact with the object to be sucked, and thus, polishing tends to be uneven.

It is desirable for the thickness of the internally solidified layer 422a to be about 5 mm or less in the neighborhood of the above-described holding surface, and it is desirable for the thickness of the coating layer 422b to be about 15 mm or less.

In the vacuum chuck according to the embodiment of the sixth present invention, as is the same in the vacuum chuck according to the embodiment of the fifth present invention, when the pore distribution in the sucking body is measured in accordance with a mercury injection method, the average pore diameter is 10 to 40 μm, the ratio of pores having a pore diameter of 0.7 to 1.2 times of the above-described average pore diameter to the total volume of the pores is about 75% or more, the ratio of pores having a pore diameter of less than 0.7 times of the above-described average pore diameter to the total volume of the pores is about 15% or less, and the ratio of pores having a pore diameter of more than 1.2 times of the above-described average pore diameter to the total volume of the pores is about 10% or less, the pore diameter of the above-described sucking body is set to an appropriate size, and there is almost no variation in the pore diameter, and therefore, the suction force is high and the suction force is uniform throughout the entirety, and there is almost no unevenness in the distribution of the suction force, and therefore, in the case where the vacuum chuck is used for a polishing apparatus, there is no such phenomenon where the pattern of pores distribution is transferred and the object to be sucked can be uniformly polished.

The vacuum chuck according to the embodiments of the fifth and sixth present invention has the above-described configuration, and the pore diameter of the above-described sucking body is set to an appropriate size with almost no variation in the pore diameter, and therefore, the suction force is strong, the suction force is uniform throughout the entirety of the vacuum chuck, and there is almost no distribution in the suction force, and thus, no phenomenon such that the pattern of the pores is transferred can be observed when the vacuum chuck is used in a polishing apparatus, and the object to be sucked can be uniformly polished.

EXAMPLES

Though examples are cited in the following to describe the embodiments of the first to sixth present inventions in further detail, the embodiments of the first to sixth present inventions are not limited to these examples.

Example 1

(1) 90 wt % of an α type silicon carbide powder having an average particle diameter of 60 μm and 10 wt % of an α type silicon carbide powder having an average particle diameter of 1.0 μm were mixed in a wet manner, and 5 parts by weight of an organic binder (methyl cellulose) and 10 parts by weight of water were added to 100 parts by weight of the gained mixture, and the mixture was kneaded, and after that, spray dried, and thus, a powder in granular form was gained.

This powder in granular form was placed into a die and kept under a pressure of 50 MPa for five minutes in a molding machine using cold isostatic pressing (CIP) so that silicon carbide molded bodies in disc form and in doughnut plate form were manufactured.

(2) Next, the above-described silicon carbide molded bodies were carried into a degreasing furnace and heated for two hours at 600° C. under an argon gas atmosphere so that the silicon carbide molded bodies were degreased.

(3) Next, the degreased silicon carbide molded bodies were fired at a temperature of 2200° C., and a member for a sucking plate A in disc form having a diameter of 129.6 mm and a thickness of 20 mm, a member for a sucking plate B in doughnut form having an inner diameter of 130 mm, an outer diameter of 179.6 mm and a thickness of 20 mm, and a member for a sucking plate C in the form of a doughnut with a brim having an inner diameter of 180 mm, an outer diameter of the upper portion of 220 mm, an outer diameter of the brim portion of 250 mm and a thickness of 20 mm, were manufactured from the sintered bodies of porous silicon carbide.

(4) Next, 100 parts by weight of a silicon carbide powder having an average particle diameter of 10 μm were mixed with 100 parts by weight of a glass (borosilicate glass) that was prepared so as to be in paste form, and the thus gained composite for the formation of an annular partition layer was applied to the side of the members for a sucking plate A to C, and then these members were assembled, and furthermore, the above-described composite for the formation of an annular partition layer was applied to the lower surface of the member for a sucking plate C (surface on the side opposite to the holding surface). After that, the members for a sucking plate A to C were joined together by being melted at 1000° C. under an oxygen atmosphere so that a sucking plate where annular partition layers and an air impermeable layer were formed was gained. Here, the Young's modulus and the coefficient of thermal expansion of the annular partition layers were 66 (GPa) and 4.4 ($\times 10^{-6}$/° C.), respectively. The thickness of the annular partition layer was 0.2 mm.

Next, a grinding process was carried out on the holding surface of the sucking plate using a diamond grinding stone so that the degree of flatness of the holding surface became 1.5 μm and the differences in height became 0.1 μm. Here, the degree of flatness and the differences in height on the holding surface were measured using a NANOMETRO made by Kuroda Precision Industries Ltd.

In addition, a pore distribution measuring apparatus (made by Shimadzu Corp.) was used to measure the pore distribution in the sucking layer for pores of which the diameter was in a range of 0.2 to 600 μm in accordance with a mercury injection method.

(5) Next, as shown in FIG. 4, the air sucking surface of the gained sucking plate 11 was attached to a holder 20, and the manufacture of the vacuum chuck 10 was completed. Here, in the manufactured sucking plate, the Young's modulus, the coefficient of thermal expansion, the porosity and the pore diameter are 60 (GPa), 4.4 ($\times 10^{-6}$/° C.), 40% and 30 μm, respectively.

Test Example 1

A vacuum chuck was manufactured in the same manner as in Example 1, except that an uncured epoxy resin was applied instead of a composite for the formation of an annular partition layer of which the main component is glass in the step (4) of Example 1, and annular partition layers were formed by curing this epoxy resin.

Here, the coefficient of thermal expansion of the annular partition layers was 70 ($\times 10^{-6}$/° C.). The thickness of the annular partition layer was 0.2 mm.

Next, a grinding process was carried out on the holding surface of the sucking plate using a diamond grinding stone so that the degree of flatness of the holding surface became 7 μm and the differences in height became 2 μm. Here, the degree of flatness and the differences in height on the holding surface were measured using a NANOMETRO made by Kuroda Precision Industries Ltd.

In addition, a pore distribution measuring apparatus (made by Shimadzu Corp.) was used to measure the pore distribution in the sucking layer for pores of which the diameter was in a range of 0.2 to 600 μm in accordance with a mercury injection method.

Here, in the manufactured sucking plate, the Young's modulus, the coefficient of thermal expansion, the porosity and the pore diameter are 60 (GPa), 4.4 ($\times 10^{-6}$/° C.), 40% and 30 μm, respectively.

Two types of silicon wafers having different diameters (wafer 1: diameter of 150 mm; wafer 2: diameter of 200 mm) were placed on the holding surface of the vacuum chuck according to Example 1 and Test Example 1 so that the center portion of the blocking wall and the center portion of the silicon wafer coincided with each other in a plan view, and this silicon wafer was sucked with a pressure of 10 KPa and 10 times of polishing process was carried out on silicon wafers in this manner, and the degree of flatness of the polished surface of the silicon wafers was evaluated. In addition, the temperature of the silicon wafer at the time of polishing was measured, and furthermore, the clamping pressure at the time of suction (pressure reached at the time of the clamping of the wafer) was measured and the existence of an air leak was checked for.

Here, the temperature of the silicon wafer was measured by a surface thermometer.

In addition, the clamping pressure (pressure reached at the time of the clamping of the wafer) was measured using a pressure gauge, and furthermore, the existence of an air leak was evaluated on the basis of the clamping pressure.

Here, the polishing process was carried out through dry polishing where a vacuum chuck which sucks and holds a silicon wafer was made to make contact with a rotating table to which a polishing cloth of a felt material was pasted. The number of rotations of the table was $1.2 \text{ s}^{-1}$.

Silicon wafers having different diameters, which were respectively placed on the vacuum chuck according to Example 1, were polished in an appropriate manner. That is to say, the degree of flatness of the surface of the silicon wafers on which a polishing process was carried out was 0.2 µm, and thus, the polishing process was carried out uniformly and with a high precision. This is considered to be because the precision on the holding surface could be maintained at a high level, and in addition, friction heat efficiently dispersed at the time of polishing, and therefore, there was almost no warping in the silicon wafer.

Here, concerning the silicon wafer 1, the temperature of the silicon wafer 1 was 33° C., and, the cramping pressure was 10 kPa. Moreover, there was no air leak. The same results were obtained in the silicon wafer 2.

Meanwhile, the degree of flatness of the surface of the respective silicon wafers on which a polishing process was carried out was 2 µm, meaning that the degree of flatness was very low in Test Example 1. This is considered to be because the degree of flatness of the holding surface of the vacuum chuck was poor and the differences in height were large, and the reason for this was considered to be that the material of the annular partition layers was an epoxy resin.

Here, concerning the silicon wafer 1, the temperature of the silicon wafer 1 was 45° C., and, the cramping pressure was 21 kPa. Moreover, there was an air leak partly. The same results were obtained in the silicon wafer 2.

Example 2

(1) 90 wt % of an α type silicon carbide powder having an average particle diameter of 60 µm and 10 wt % of an α type silicon carbide powder having an average particle diameter of 1.0 µm were mixed in a wet manner, and 5 parts by weight of an organic binder (methyl cellulose) and 10 parts by weight of water were added to 100 parts by weight of the gained mixture, and the mixture was kneaded, and after that, spray dried, and thus, a powder in granular form was gained.

This powder in granular form was placed into a die and kept under a pressure of 50 MPa for five minutes in a molding machine using cold isostatic pressing (CIP) so that silicon carbide molded bodies in disc form and in doughnut plate form were manufactured.

(2) Next, the above-described silicon carbide molded bodies were carried into a degreasing furnace and heated for two hours at 600° C. under an argon gas atmosphere so that the silicon carbide molded bodies were degreased.

(3) Next, the degreased silicon carbide molded bodies were fired at a temperature of 2200° C., and a suction portion A in disc form having a diameter of 129.6 mm and a thickness of 20 mm, a suction portion B in doughnut form having an inner diameter of 130 mm, an outer diameter of 179.6 mm and a thickness of 20 mm, and a suction portion C in the form of a doughnut with a brim having an inner diameter of 180 mm, an outer diameter of the upper portion of 220 mm, an outer diameter of the brim portion of 250 mm and a thickness of 20 mm, were manufactured from the sintered bodies of porous silicon carbide.

(4) Next, a glass (borosilicate glass) that was prepared so as to be in paste form was applied to the side of the suction portions A to C, and then these portions were assembled, and furthermore, the glass in paste form was applied to the lower surface of the suction portion C (surface on the side opposite to the holding surface). After that, the suction portions A to C were joined together by being melted at 1000° C. under an oxygen atmosphere, so that a sucking plate where annular partition layers and an air impermeable layer were formed was gained. Here, the Young's modulus and the coefficient of thermal expansion of the annular partition layers and the air impermeable layer were 66 (GPa) and 4.4 ($\times 10^{-6}$/° C.), respectively. The thickness of the annular partition layer was 0.2 mm.

Next, a grinding process was carried out on the holding surface of the sucking plate using a diamond grinding stone, so that the degree of flatness of the holding surface became 1 µm and the differences in height became 0.1 µm. Here, the degree of flatness and the differences in height on the holding surface were measured using a NANOMETRO made by Kuroda Precision Industries Ltd.

In addition, a pore distribution measuring apparatus (made by Shimadzu Corp.) was used to measure the pore distribution in the sucking layer for pores of which the diameter was in a range of 0.2 to 600 µm in accordance with a mercury injection method.

(5) Next, as shown in FIG. 8, the air sucking surface of the gained sucking plate 311 was attached to a holder 320, and the manufacture of the vacuum chuck 310 was completed. Here, in the manufactured sucking plate, the Young's modulus, the coefficient of thermal expansion, the porosity and the pore diameter are 60 (GPa), 4.4 ($\times 10^{-6}$/° C.), 40% and 30 µm, respectively.

Two types of silicon wafers having different diameters (wafer 1: diameter of 150 mm; wafer 2: diameter of 200 mm) were placed on the holding surface of the vacuum chuck according to Examples 2, so that the center portion of the blocking wall and the center portion of the silicon wafer coincided with each other in a plan view, and this silicon wafer was sucked with a pressure of 10 KPa and 10 times of polishing process carried out on silicon wafers in this manner, and the degree of flatness of the polished surface of the silicon wafers was evaluated. In addition, the temperature of the silicon wafer at the time of polishing was measured using the same method as for the evaluation of the vacuum chuck according to Example 1, and furthermore, the clamping pressure at the time of suction (pressure reached at the time of the clamping of the wafer) was measured and the existence of an air leak was checked for.

Here, the polishing process was carried out through wet polishing. That is to say, silica slurry was applied to a table to which a polishing cloth of a felt material was pasted, and after that, this table was rotated and this was made to make contact with the vacuum chuck which sucked and held a silicon wafer, and thereby, polishing was carried out. The number of rotations of the table was $1.2 \text{ s}^{-1}$.

Silicon wafers having different diameters which were respectively placed on the vacuum chuck according to Example 2, were polished in an appropriate manner. That is to say, the degree of flatness of the surface of the silicon wafers on which a polishing process was carried out was 0.1 μm, and thus, the polishing process was carried out uniformly and with a high precision. This is considered to be because the degree of flatness of the holding surface was as small as 1 μm and the differences in height were 0.1 μm, which is sufficiently small.

Here, concerning the silicon wafer 1, the temperature of the silicon wafer 1 was 40° C., and, the cramping pressure was 10 kPa. Moreover, there was no air leak. The same results were obtained in the silicon wafer 2.

What is claimed as new and desired to be secured by Letters Patent of the United States is:

1. A vacuum chuck comprising:
   a sucking body comprising a porous ceramic and having a holding surface configured to suck and hold an object; and
   a sealing body sealing substantially an entire surface of said sucking body, excluding the holding surface and an air sucking hole corresponding portion of the sucking body,
   wherein when the pore distribution in said sucking body is measured in accordance with a mercury injection method, the average pore diameter is 10 to 40 μm, the ratio of pores having a pore diameter of 0.7 to 1.2 times of said average pore diameter to the total volume of pores is about 75% or more, the ratio of pores having a pore diameter of less than 0.7 times of said average pore diameter to the total volume of pores is about 15% or less, and the ratio of pores having a pore diameter of more than 1.2 times of said average pore diameter to the total volume of pores is about 10% or less.

2. A vacuum chuck comprising:
   a sucking body comprising a porous ceramic and having a holding surface configured to suck and hold an object; and
   a sealing layer formed on the sucking body and sealing substantially an entire surface of the sucking body, excluding said holding surface and an air sucking hole corresponding portion of the sucking body,
   wherein when the pore distribution in the sucking body is measured in accordance with a mercury injection method, the average pore diameter is 10 to 40 μm, the ratio of pores having a pore diameter of 0.7 to 1.2 times of said average pore diameter to the total volume of pores is about 75% or more, the ratio of pores having a pore diameter of less than 0.7 times of said average pore diameter to the total volume of pores is about 15% or less, and the ratio of pores having a pore diameter of more than 1.2 times of the average pore diameter to the total volume of pores is about 10% or less.

3. The vacuum chuck according to claim 2, wherein the sealing layer includes a portion in a neighborhood of the holding surface of the sucking body and the portion of the sealing layer comprises a coating layer formed on a surface of said sucking body.

4. The vacuum chuck according to any of claims 1 to 3, wherein the porosity of the sucking body is about 20 to about 50%.

* * * * *

UNITED STATES PATENT AND TRADEMARK OFFICE
CERTIFICATE OF CORRECTION

| | |
|---|---|
| PATENT NO. | : 7,654,887 B2 |
| APPLICATION NO. | : 11/525820 |
| DATED | : February 2, 2010 |
| INVENTOR(S) | : Shigeharu Ishikawa et al. |

It is certified that error appears in the above-identified patent and that said Letters Patent is hereby corrected as shown below:

On the front page, Item (54) and Col. 1, line 1, change the Title of the Invention, "VACUUM CHUCK AND SUCTION BOARD" to --VACUUM CHUCK--.

Signed and Sealed this

First Day of June, 2010

David J. Kappos
*Director of the United States Patent and Trademark Office*